(12) United States Patent
Tazaki et al.

(10) Patent No.: US 10,374,190 B2
(45) Date of Patent: Aug. 6, 2019

(54) SEALING FILM, ORGANIC ELECTROLUMINESCENT DISPLAY, AND ORGANIC SEMICONDUCTOR DEVICE

(71) Applicant: ZEON CORPORATION, Tokyo (JP)

(72) Inventors: Satoshi Tazaki, Tokyo (JP); Hiroyasu Inoue, Tokyo (JP); Atsushi Ishiguro, Tokyo (JP); Yohei Koide, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 124 days.

(21) Appl. No.: 15/108,138

(22) PCT Filed: Dec. 25, 2014

(86) PCT No.: PCT/JP2014/084389
§ 371 (c)(1),
(2) Date: Jun. 24, 2016

(87) PCT Pub. No.: WO2015/099079
PCT Pub. Date: Jul. 2, 2015

(65) Prior Publication Data
US 2016/0343970 A1    Nov. 24, 2016

(30) Foreign Application Priority Data

Dec. 26, 2013    (JP) .................................. 2013-269726

(51) Int. Cl.
| | | |
|---|---|---|
| *B32B 3/08* | (2006.01) | |
| *B32B 27/28* | (2006.01) | |
| *B32B 7/10* | (2006.01) | |
| *B32B 7/04* | (2019.01) | |
| *B32B 27/32* | (2006.01) | |
| *B32B 27/08* | (2006.01) | |
| *B32B 7/12* | (2006.01) | |
| *B32B 7/02* | (2019.01) | |
| *H01L 51/52* | (2006.01) | |
| *H01L 29/786* | (2006.01) | |
| *B32B 27/30* | (2006.01) | |
| *G02B 5/30* | (2006.01) | |
| *H01L 27/12* | (2006.01) | |

(52) U.S. Cl.
CPC .............. *H01L 51/524* (2013.01); *B32B 3/08* (2013.01); *B32B 7/02* (2013.01); *B32B 7/04* (2013.01); *B32B 7/10* (2013.01); *B32B 7/12* (2013.01); *B32B 27/08* (2013.01); *B32B 27/28* (2013.01); *B32B 27/302* (2013.01); *B32B 27/32* (2013.01); *G02B 5/3083* (2013.01); *H01L 27/1248* (2013.01); *H01L 29/786* (2013.01); *B32B 2250/03* (2013.01); *B32B 2307/40* (2013.01); *B32B 2307/416* (2013.01); *B32B 2307/418* (2013.01); *B32B 2307/42* (2013.01); *B32B 2307/51* (2013.01); *B32B 2307/54* (2013.01); *B32B 2405/00* (2013.01); *B32B 2457/20* (2013.01); *B32B 2457/206* (2013.01); *B32B 2581/00* (2013.01); *H01L 51/5281* (2013.01)

(58) Field of Classification Search
None
See application file for complete search history.

(56) References Cited

U.S. PATENT DOCUMENTS

| | | | |
|---|---|---|---|
| 4,869,966 A * | 9/1989 | Samuelson ......... | B32B 17/1055 428/428 |
| 8,531,765 B2 | 9/2013 | Sakai et al. | |
| 9,871,227 B2 * | 1/2018 | Inoue ................. | H01L 51/5275 |
| 2012/0319572 A1 | 12/2012 | Lee et al. | |
| 2013/0244367 A1 | 9/2013 | Kohara et al. | |
| 2015/0349290 A1 | 12/2015 | Iwase | |

FOREIGN PATENT DOCUMENTS

| | | |
|---|---|---|
| CN | 101817250 A | 9/2010 |
| CN | 102832352 A | 12/2012 |
| JP | 2006-330604 A | 12/2006 |
| JP | 2009-190186 A | 8/2009 |
| JP | 2009-210789 A | 9/2009 |
| JP | 2012-032418 A | 2/2012 |
| JP | 2014-180794 A | 9/2014 |
| WO | 2012/043708 A1 | 4/2012 |
| WO | 2013/147093 A1 | 10/2013 |

OTHER PUBLICATIONS

Jul. 6, 2017 Extended Search Report issued in European Patent Application No. 14875321.3.
Mar. 3, 2015 Search Report issued in International Patent Application No. PCT/JP2014/084389.
Mar. 3, 2015 Written Opinion issued in International Patent Application No. PCT/JP2014/084389.
Dec. 23, 2016 Office Action issued in Chinese Patent Application No. 201480068188.1.
Sep. 18, 2018 Office Action issued in Japanese Patent Application No. 2015-555020.

\* cited by examiner

*Primary Examiner* — Sheeba Ahmed
(74) *Attorney, Agent, or Firm* — Oliff PLC

(57) ABSTRACT

A sealing film including a substrate film, a sealing layer, and an adhesive layer in this order, wherein the sealing film has a tensile elastic modulus of equal to or higher than 1,000 MPa, and retardation of a layer portion provided at the sealing layer side relative to the substrate film in the sealing film after sealing is equal to or smaller than 20 nm.

16 Claims, 5 Drawing Sheets

SEALING FILM, ORGANIC ELECTROLUMINESCENT DISPLAY, AND ORGANIC SEMICONDUCTOR DEVICE

FIELD

The present invention relates to a sealing film, and an organic electroluminescent display device and an organic semiconductor device including the sealing film.

BACKGROUND

Organic electronic devices including elements such as an organic electroluminescent element (this may be appropriately referred to hereinbelow as an "organic EL element") and an organic semiconductor element may be provided with a sealing member. Provision of such a sealing member in a manner of sealing an organic material in the device can prevent deterioration of the organic material due to water vapor and oxygen, and can eventually prevent lowering of device performance. As such a member, there has been proposed a sealing film including an inorganic layer (see Patent Literature 1).

Among the above-mentioned organic electronic devices, display devices may be provided with an anti-reflective film in order to prevent image reflection of external light on a screen. As such an anti-reflective film, there has been known one including a circularly polarizing plate having a combination of a linearly polarizing plate and a quarter wavelength plate (see Patent Literature 2).

CITATION LIST

Patent Literature

Patent Literature 1: Japanese Patent Application Laid-open No. 2009-190186 A
Patent Literature 2: Japanese Patent Application Laid-open No. 2012-032418 A

SUMMARY

Technical Problem

The present inventors have made an attempt to provide an adhesive layer on a sealing film in order to facilitate an operation of providing the sealing film on a device. It has been, however, found out that the sealing film including the adhesive layer causes lowering in reflection prevention performance when it is combined with an anti-reflective film having a circularly polarizing plate.

In recent years, demand for reduction in thickness of the devices is growing. With this growing demand, there is a need for reducing thickness of the sealing film. The thickness reduction of the sealing film however lowers mechanical strength of the sealing film and the sealing film thereby may lack stiffness. The film lacking stiffness has low handling performance, which renders appropriate sealing operation difficult.

The present invention has been made in view of the above-mentioned problems and an object thereof is to provide a sealing film that is not prone to lower the reflection prevention performance when it is combined with an anti-reflective film having a circularly polarizing plate, is excellent in handling performance, and enables preferable sealing, and an organic electroluminescent display device and an organic semiconductor device including the sealing film.

Solution to Problem

The present inventors have intensively studied to achieve the above-mentioned object. As a result, the inventors have found out a sealing film including a substrate film, a sealing layer, and an adhesive layer in this order, in which a tensile elastic modulus of the sealing film is within a specific range and retardation after a layer portion is sealed at the sealing layer side relative to the substrate film in the sealing film is sealed is within a specific range. The inventors have further found out that the sealing film is not prone to lower reflection prevention performance when it is combined with an anti-reflective film including a circularly polarizing plate, is excellent in handling performance, and enables preferable sealing. Accordingly, the present invention has been completed.

That is, the present invention is as follows.

(1) A sealing film comprising a substrate film, a sealing layer, and an adhesive layer in this order, wherein
the sealing film has a tensile elastic modulus of equal to or higher than 1,000 MPa, and
retardation of a layer portion provided at the sealing layer side relative to the substrate film in the sealing film after sealing is equal to or smaller than 20 nm.

(2) The sealing film according to (1), wherein the adhesive layer contains a hydrogenated block copolymer elastomer.

(3) The sealing film according to (2), wherein
the hydrogenated block copolymer elastomer is hydride formed by hydrogenating equal to or higher than 90% of all unsaturated bonds of a block copolymer,
the block copolymer has two or more polymer blocks [A] per molecule of the copolymer, and one or more polymer blocks [B] per molecule of the copolymer, the block [A] having as a main component an aromatic vinyl compound unit, and the block [B] having as a main component a linear conjugated diene compound unit, and
a ratio (wA/wB) between a weight fraction wA of all the polymer blocks [A] and a weight fraction wB of all the polymer blocks [B] in the entire block copolymer is 20/80 to 60/40.

(4) The sealing film according to any one of (1) to (3), wherein the substrate film is made of alicyclic olefin resin.

(5) An organic electroluminescent display device comprising the sealing film according to any one of (1) to (4).

(6) An organic semiconductor device comprising the sealing film according to any one of (1) to (4).

Advantageous Effects of Invention

The present invention can provide a sealing film that is not prone to lower reflection prevention performance when it is combined with an anti-reflective film including a circularly polarizing plate, is excellent in handling performance, and enables preferable sealing, and an organic electroluminescent display device and an organic semiconductor device including the sealing film.

DESCRIPTION OF EMBODIMENTS

The present invention will be described hereinbelow in detail referring to embodiments and exemplifications. However, the present invention is not limited to the following embodiments and exemplifications. The present invention may be implemented with any modifications without departing from the scope of the present invention and equivalents thereto.

In the following description, a "long-length" film is a film having a length equal to or larger than five times the width, and preferably equal to or larger than ten times the width. Specifically, the "long-length" film is a film having such length that it is capable of being wound into a roll form for storage and transportation. The upper limit of magnification of the length relative to the width is not particularly limited but may be set to be usually equal to or smaller than 5,000 times.

Unless otherwise specified, a "polarizing plate" and a "quarter wavelength plate" in the following description include not only rigid members but also members having flexibility, such as a film made of resin.

Unless otherwise specified, retardation in the following description indicates in-plane retardation. The in-plane retardation of a certain film is a value expressed by $(nx-ny) \times d$. $nx$ is a refractive index in the direction perpendicular to the thickness direction (in-plane direction) of the film, the direction giving a maximum refractive index. $ny$ is a refractive index in the in-plane direction of the film that is orthogonal to the direction of $nx$. $d$ is the thickness of the film. The retardation may be measured using a commercially available phase difference measuring device (for example, "WPA-micro" manufactured by Photonic Lattice, Inc.) or the Senarmont method. Unless otherwise specified, the measurement wavelength of the in-plane retardation is 550 nm.

1. Outline of Sealing Film

Figure 1:
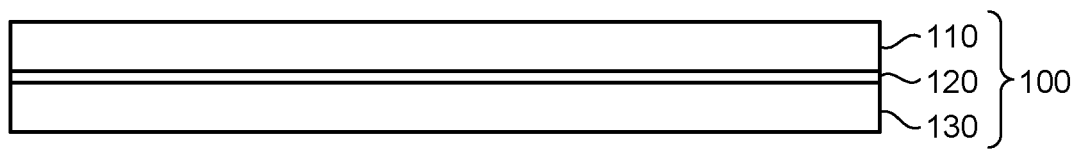
FIG. 1 is a sectional view schematically illustrating an example of a sealing film according to the present invention.

FIG. 1 is a sectional view schematically illustrating an example of a sealing film of the present invention.

As illustrated in FIG. 1, a sealing film 100 includes a substrate film 110, a sealing layer 120, and an adhesive layer 130 in this order. In an organic electronic device having elements such as organic EL elements and organic semiconductor elements, the sealing film 100 is usually used for sealing such elements. Use of the sealing film 100 enables preferable sealing of the elements included in the device, to thereby effectively prevent deterioration of an organic material contained in the elements due to water and oxygen.

2. Substrate Film

As the substrate film, a resin film is usually used. In particular, transparent resin is preferably used for the substrate film from the viewpoint of usefulness of the sealing film for a portion required to transmit light in a display device and a light source device. That a resin is transparent means that a substrate film made of the resin has high light transmittance to the extent capable of being used for an optical application. Specifically, when the resin is formed into a sample piece having a thickness of 1 mm and the total light transmittance thereof is measured, it is desired that the resin has the total light transmittance of usually equal to or higher than 70%, preferably equal to or higher than 80%, and more preferably equal to or higher than 90%.

As the resin forming the substrate film, e.g., any of a thermoplastic resin, a thermosetting resin, an ultraviolet curable resin, and an electron beam curable resin may be used. In particular, the thermoplastic resin is preferable because therewith processing can be easily performed. Examples of the thermoplastic resin may include a polyester resin, a polyacrylate resin, and an olefin resin.

Among them, a film made of an alicyclic olefin resin is preferably used as the substrate film. The alicyclic olefin resin is resin containing an alicyclic olefin polymer and, if necessary, another optional component. The alicyclic olefin resin has a low hygroscopic property and is excellent in mechanical strength. The alicyclic olefin resin discharges a reduced amount of outgas in processes of vapor deposition and sputtering when the sealing layer is formed. Therefore, with use of the film made of the alicyclic olefin resin as the substrate film, a sealing film having high barrier property can be obtained. In particular, the substrate film manufactured by melting and extruding the alicyclic olefin resin has good surface smoothness with diminished protrusions on the surface thereof. The protrusion on the substrate film can cause cracking of the layer. Therefore, the substrate film made of the alicyclic olefin resin does not require a thick sealing layer for ensuring high barrier property, which results in excellent productivity and flexibility.

An alicyclic olefin polymer is an amorphous thermoplastic polymer with a main chain and/or a side chain having an alicyclic structure. The alicyclic olefin polymer usually has a structure obtained by polymerization of an alicyclic olefin. The alicyclic structure included in the alicyclic olefin polymer may have a saturated alicyclic hydrocarbon (cycloalkane) structure, and may also have an unsaturated alicyclic hydrocarbon (cycloalkene) structure. From the viewpoint of mechanical strength, heat tolerance, and the like, the cycloalkane structure is preferable. The number of carbon atoms constituting one alicyclic structure is usually four or more, preferably five or more, and usually 30 or less, preferably 20 or less, and more preferably 15 or less. The number of carbon atoms constituting one alicyclic structure being within the range is preferable since thereby properties such as mechanical strength, heat tolerance, and film formability, are highly balanced.

The ratio of structural units having an alicyclic structure in the entire alicyclic olefin polymer is preferably 55% by weight or more, more preferably 70% by weight or more, and particularly preferably 90% by weight or more. The ratio of the structural units having an alicyclic structure in the alicyclic olefin polymer being within this range is preferable because of the viewpoint of transparency and heat tolerance.

Examples of the alicyclic olefin polymer may include a norbornene polymer, a monocyclic olefin polymer, a cyclic conjugated diene polymer, a vinyl alicyclic hydrocarbon polymer, and hydrides thereof. Among those listed herein, a norbornene polymer may be preferably used because the norbornene polymer exhibits high transparency and formability.

Examples of the norbornene polymer may include a ring-opening polymer of a monomer having a norbornene structure, a ring-opening copolymer of a monomer having a norbornene structure and an optional monomer, and hydrides of the polymer or the copolymer; an addition polymer of a monomer having a norbornene structure, an addition copolymer of a monomer having a norbornene structure and an optional monomer, and hydrides of such addition polymer and addition copolymer. Among those listed herein, the hydride of the ring-opening (co)polymer of a monomer having a norbornene structure is particularly preferable from the viewpoint of formability, heat tolerance, low hygroscopicity, dimensional stability, and lightness. The term "(co)polymer" herein means those including the polymer as well as the copolymer.

Examples of the monomer having a norbornene structure may include bicyclo[2.2.1]hept-2-ene (common name: norbornene), tricyclo[4.3.0.1$^{2,5}$]deca-3,7-diene (common name: dicyclopentadiene), 7,8-benzotricyclo[4.3.0.1$^{2,5}$]deca-3-ene (common name: methano-tetrahydrofluorene), tetracyclo[4.4.0.1$^{2,5}$.1$^{7,10}$]dodeca-3-ene (common name: tetracyclododecene), and derivatives of these components (e.g., those with a substituent in the ring). Examples of the substituent may include an alkyl group, an alkylene group, and a polar group. As the substituent, a plurality of the same or different substituents may be bound to the ring. As the monomer having a norbornene structure, one type thereof may be solely used, and two or more types thereof may also be used in combination at any ratio.

Example types of the polar group may include a heteroatom, and a group of atoms including a heteroatom. Examples of the heteroatom may include an oxygen atom, a nitrogen atom, a sulfur atom, a silicon atom, and a halogen atom. Specific examples of the polar group may include carboxy group, carbonyl oxy carbonyl group, epoxy group, hydroxy group, oxy group, ester group, silanol group, silyl group, amino group, nitrile group, and sulfonate group.

Examples of the optional monomer capable of undergoing ring-opening copolymerization with a monomer having a norbornene structure may include a monocyclic olefin such as cyclohexene, cycloheptene, and cyclooctene and their derivatives; a cyclic conjugated diene such as cyclohexadiene and cycloheptadiene, and their derivatives. As the optional monomer capable of undergoing ring-opening copolymerization with a monomer having a norbornene structure, one type thereof may be solely used, and two or more types thereof may also be used in combination at any ratio.

The ring-opening polymer of the monomer having a norbornene structure, and the ring-opening copolymer of the monomer having a norbornene structure and the optional monomer that is capable of undergoing copolymerization therewith may be manufactured by, e.g., polymerization or copolymerization of the monomers in the presence of a publicly known ring-opening polymerization catalyst.

Examples of the optional monomer capable of undergoing addition copolymerization with the monomer having a norbornene structure may include an α-olefin having 2 to 20 carbon atoms such as ethylene, propylene, and 1-butene, and their derivatives; a cycloolefin such as cyclobutene, cyclopentene, and cyclohexene, and their derivative; an unconjugated diene such as 1,4-hexadiene, 4-methyl-1,4-hexadiene, and 5-methyl-1,4-hexadiene. Among those listed herein, an α-olefin is preferable, and ethylene is more preferable. As the optional monomer capable of undergoing addition copolymerization with the monomer having a norbornene structure, one type thereof may be solely used, and two or more types thereof may also be used in combination at any ratio.

The addition polymer of the monomer having a norbornene structure, and the addition copolymer of the monomer having a norbornene structure and the optional monomer capable of undergoing copolymerization therewith may be manufactured by, e.g., polymerization or copolymerization of the monomers in the presence of a publicly known addition polymerization catalyst.

The hydride of the polymer such as the ring-opening polymer of the monomer having a norbornene structure, and the ring-opening copolymer of the monomer having a norbornene structure and the monomer capable of undergoing ring-opening copolymerization therewith; and the addition polymer of the monomer having a norbornene structure, and the addition copolymer of the monomer having a norbornene structure and the monomer capable of undergoing copolymerization therewith may be manufactured using any manufacturing method. For example, the hydride of the aforementioned polymer may be manufactured by hydrogenating the carbon-carbon unsaturated bonds, preferably 90% or higher thereof, in a solution of such a polymer, in the presence of a publicly known catalyst for hydrogenation containing a transition metal such as nickel or palladium.

The molecular weight of the alicyclic olefin polymer in the alicyclic olefin resin is appropriately selected in accordance with the intended use. The weight-average molecular weight (Mw) of the alicyclic olefin polymer is usually 10,000 or more, preferably 15,000 or more, and more preferably 20,000 or more, and is usually 100,000 or less, preferably 80,000 or less, and more preferably 50,000 or less. The weight-average molecular weight within the range is preferable because thereby the mechanical strength of the resultant substrate film and the forming workability can be highly balanced. The weight-average molecular weight of the alicyclic olefin polymer may be measured in terms of polyisoprene using gel permeation chromatography with use of cyclohexane as a solvent. When polymer does not dissolve in cyclohexane, toluene may be used as a solvent. When toluene is used as the solvent, the weight-average molecular weight may be measured in terms of polystyrene.

The ratio of the alicyclic olefin polymer in the alicyclic olefin resin is preferably 67% by weight to 100% by weight, and more preferably 77% by weight to 100% by weight.

As the above-mentioned alicyclic olefin polymer, one type thereof may be solely used, and two or more types thereof may also be used in combination at any ratio.

Examples of the optional component that the alicyclic olefin resin may contain may include additives such as an antioxidant, a heat stabilizer, a light stabilizer, an ultraviolet absorbent, an antistatic agent, a dispersing agent, a chlorine capturing agent, a flame retardant, a crystallization nucleating agent, a reinforcing agent, an antiblocking agent, an antifogging agent, a mold release agent, a pigment, an organic or inorganic filler, a neutralizer, a lubricant, a decomposing agent, a metal inactivating agent, a contamination preventing agent, an antibacterial agent, an optional polymer, and a thermoplastic elastomer. One type thereof may be solely used, and two or more types thereof may also be used in combination at any ratio.

The amount of the additives may be set to a value within a range that does not impair an effect of the present invention. For example, the amount of the additives is usually 0 to 50 parts by weight and preferably 0 part by weight to 30 parts by weight with respect to 100 parts by weight of the alicyclic olefin polymer contained in the alicyclic olefin resin.

It is preferable that the resin forming the substrate film has a high glass transition temperature. The specific glass transition temperature of the resin forming the substrate film is preferably equal to or higher than 110° C., more preferably equal to or higher than 130° C., and particularly preferably equal to or higher than 160° C. The resin having a high glass transition temperature has low tendency to cause thermal shrinkage by temperature change, and can thus suppress lowering of the barrier property of the sealing film in a high temperature environment. Although the upper limit of the glass transition temperature of the resin forming the substrate film is not particularly limited, it is preferably equal to or lower than 300° C.

The substrate film may be a film having a single layer structure consisting of one layer, and may also be a film having a multilayer structure having two or more layers.

The thickness of the substrate film is preferably equal to or larger than 10 μm and more preferably equal to or larger than 30 μm, and preferably equal to or smaller than 500 μm and more preferably equal to or smaller than 250 μm. The substrate film having such thickness is excellent in both the mechanical strength and the barrier property with good balance.

The retardation of the substrate film can be arbitrarily set in accordance with the use of the sealing film.

For example, when the sealing film is used in combination with an anti-reflective film formed by a circularly polarizing plate having a combination of a linearly polarizing plate and a quarter wavelength plate, it is preferable that the retardation of the substrate film is small in order not to lower a reflection prevention function by the anti-reflective film. Specifically, the retardation of the substrate film is preferably equal to or smaller than 10 nm and more preferably equal to or smaller than 5 nm.

Alternatively, when the substrate film of the sealing film is used as, e.g., the quarter wavelength plate of the aforementioned circularly polarizing plate, it is preferable that the substrate film has a retardation of a quarter wavelength. The retardation of the quarter wavelength is a retardation in a range of usually ±65 nm, preferably ±30 nm, and more preferably ±10 nm from a value that is a quarter of the measurement wavelength 550 nm, or in a range of usually ±65 nm, preferably ±30 nm, and more preferably ±10 nm from a three-fourth value of the center value.

Any method for manufacturing the substrate film may be employed. For example, when the substrate film is manufactured with the thermoplastic resin, the substrate film may be manufactured by molding the resin into a form of film by melt molding, solution casting, or the like. The melt molding may be further classified into, e.g., extrusion molding, press molding, inflation molding, injection molding, blow molding, and stretch molding. Among these methods, the extrusion molding, the inflation molding, or the press molding is preferably employed for obtaining a substrate film having excellent mechanical strength, surface precision, and the like. Furthermore, the extrusion molding is particularly preferable for manufacturing the substrate film efficiently and simply.

For example, when the substrate film having a retardation is manufactured, a stretching step of stretching the film may be performed upon manufacture of the substrate film. With this step, a stretched film can be obtained as the substrate film. Examples of the stretching method may include uniaxial stretching methods such as a method in which the film is uniaxially stretched in the longitudinal direction using difference in circumferential velocities of rolls and a method in which the film is uniaxially stretched in the transverse direction using a tenter stretching machine; biaxial stretching methods such as a simultaneous biaxial stretching method and a sequential biaxial stretching method; and a method in which the film is stretched in the diagonal direction using the tenter stretching machine. The diaconal direction is the direction that is not parallel with the longitudinal direction nor the transverse direction.

3. Sealing Layer

The sealing layer is a layer having a function of blocking water. The sealing layer usually has a function of blocking not only water but also oxygen. As the sealing film can block water and oxygen with the sealing layer, deterioration of the organic material in the device including the sealing film due to water vapor and oxygen can be prevented.

The extent of the function of blocking water that a sealing agent has may be expressed based on water vapor permeability in the following manner. That is, the water vapor permeability of the sealing layer is usually equal to or lower than 1.0 $g/m^2 \cdot day$, preferably equal to or lower than 0.2 $g/m^2 \cdot day$, and more preferably equal to or lower than 0.1 $g/m^2 \cdot day$.

Usually, the sealing layer is made of an inorganic material.

In general, the inorganic material tends to incur scratches and cracks. However, as the sealing layer is interposed between the substrate film and the adhesive layer in the sealing film of the present invention, the sealing layer is less prone to incur scratches and cracks due to external force. Consequently, even when the sealing layer is made of the inorganic material, the sealing layer is less prone to incur scratches and cracks, and the barrier property is not easily impaired.

In general, the alicyclic olefin resin that may be used as the material of the substrate film has low affinities with other materials in many cases. The sealing layer made of the inorganic material can however have a high affinity with the substrate film made of the alicyclic olefin resin. Usually, the inorganic material can also have a high affinity with a hydrogenated block copolymer elastomer that is capable of forming the adhesive layer. Consequently, by providing the sealing layer made of the inorganic material between the substrate film and the adhesive layer, good adhesiveness between the substrate film and the adhesive layer can be achieved.

Preferable examples of the inorganic material capable of forming the sealing layer may include metal (including half metal); metal compounds such as metal oxides, metal nitrides, and metal oxynitrides; and diamond-like carbon (DLC). Examples of the above-mentioned metal may include aluminum and silicon. Among these inorganic materials, materials essentially containing silicon, such as silicon oxides, silicon nitrides, and silicon oxynitrides, are particularly preferable from the viewpoint of transparency. The DLC is particularly preferable from the viewpoint of an affinity with the alicyclic olefin resin that may be the material of the substrate film.

Examples of the silicon oxide may include $SiO_x$. x is a value usually larger than 1.4 and preferably larger than 1.5, and usually smaller than 2.0 and preferably smaller than 1.9 from the viewpoint of achieving both the transparency and the barrier property of the sealing layer. Furthermore, examples of the silicon oxide may also include SiOC.

Examples of the silicon nitride may include $SiN_y$. y is a value usually larger than 0.5 and preferably larger than 1.2, and usually smaller than 1.5 from the viewpoint of achieving both the transparency and the barrier property of the sealing layer.

Examples of the silicon oxynitride may include $SiO_pN_q$. When improvement in adhesiveness of the sealing layer is emphasized, the sealing layer is formed as an oxygen-rich film with $1<p<2.0$ and $0<q<1.0$. When improvement in barrier property of the sealing layer is emphasized, the sealing layer is formed as a nitrogen-rich film with $0<p<0.8$ and $0.8<q<1.3$.

Examples of the aluminum oxide, the aluminum nitride, and the aluminum oxynitride may include $AlO_x$, $AlN_y$, and $AlO_pN_q$.

Among them, $SiO_pN_q$ and $AlO_x$ may be used as more preferable materials from the viewpoint of the barrier property.

As these inorganic materials, one type thereof may be solely used, and two or more types thereof may also be used in combination at any ratio.

The thickness of the sealing layer is preferably equal to or larger than 3 nm, more preferably equal to or larger than 10 nm, and particularly preferably equal to or larger than 100 nm, and preferably equal to or smaller than 2,500 nm, more preferably equal to or smaller than 2,000 nm, and particularly preferably equal to or smaller than 1,000 nm. By setting the thickness of the sealing layer to be equal to or larger than the lower limit of the above-mentioned range, preferable barrier property can be obtained. Furthermore, by setting the thickness of the sealing layer to be equal to or smaller than the upper limit, the sealing film can be prevented from turning yellow while maintaining sufficient barrier property.

Any method for forming the sealing layer may be employed. For example, when the sealing layer is formed with the inorganic material, a formation method such as a vapor deposition method, a sputtering method, an ion plating method, an ion beam-assist deposition method, an arc-discharge plasma deposition method, a thermal chemical vapor deposition (CVD) method, and a plasma CVD method may be employed. Among them, employment of the arc-discharge plasma deposition method causes generation of evaporated particles having appropriate energy, and a high-density film can thereby be formed. With the chemical vapor deposition method such as the thermal CVD method and the plasma CVD method, a sealing layer having flexibility can be formed by adjusting the gas component for forming the film, and cracks of the sealing layer can thereby be effectively prevented. When a sealing layer containing components of a plurality of types is formed, these components may be vapor deposited or sputtered simultaneously.

4. Adhesive Layer

The adhesive layer is a layer capable of giving adhesiveness to another member when the sealing film is bonded to the member. In particular, it is preferable that the adhesive layer has sufficiently high adhesiveness to an inorganic substance. For example, when the adhesive layer is attached to a glass plate, peeling strength required to peel the adhesive layer from the glass plate is usually equal to or higher than 5 N/cm and preferably equal to or higher than 10 N/cm. Although the upper limit of the above-mentioned peeling strength is not particularly limited, it is usually equal to or lower than 200 N/cm.

It is preferable that the adhesive layer is a flexible layer. The flexible adhesive layer can deform to absorb external force when the external force is applied to the device including the sealing film, thereby preventing breakage of the elements in the device due to the external force. Furthermore, when the sealing film seals the elements, the adhesive layer can deform in conformity with shapes of the surfaces of the elements. This can facilitate the sealing film to make close contact with the elements with no gap therebetween, thereby stably preventing detachment of the sealing film from the elements. When flexibility of the adhesive layer is expressed based on a tensile elastic modulus, the adhesive layer has a tensile elastic modulus usually lower than that of the substrate film. The tensile elastic modulus of the adhesive layer is preferably equal to or lower than 1,500 MPa, more preferably equal to or lower than 1,000 MPa, and particularly preferably equal to or lower than 800 MPa. The tensile elastic modulus is a value measured at 23° C. Although the lower limit of the above-mentioned tensile elastic modulus is not particularly limited, it is usually equal to or higher than 0.1 MPa.

4.1. Material of Adhesive Layer

As the material of the adhesive layer having the adhesiveness and the flexibility as mentioned above, a resin is usually used. In particular, it is preferable to use an elastomer resin. The elastomer resin is a resin containing an elastomer and, if necessary, an optional component. The elastomer is a polymer having rubber elasticity at a room temperature even without vulcanization processing. The room temperature is usually 25° C. In general, the elastomer resin does not contain or, even if it does, contains a small amount of a residual solvent. Therefore, the amount of an outgas from the elastomer resin is small. Accordingly, the elastomer resin is not prone to generate gas under a low pressure environment. Therefore, with the elastomer resin, it is possible to prevent the adhesive layer itself from being a gas generation source.

4.1.1. Elastomer

As the elastomer, a block copolymer elastomer and a hydrogenated block copolymer elastomer are preferable. The block copolymer elastomer is an elastomer made of a block copolymer. The hydrogenated block copolymer elastomer is an elastomer made of a hydride of the block copolymer. Usually, nature of the block copolymer and the hydride thereof can be adjusted based on types and ratio of polymer blocks contained in the molecular structure thereof. When the block copolymer or the hydride thereof is an elastomer, the block copolymer usually contains a polymer block as a rubber component having elasticity in a molecule (that is, soft segment) and a polymer block as a molecule constraint component for preventing plastic deformation (that is, hard segment).

As the above-mentioned block copolymer, an aromatic vinyl compound-conjugated diene block copolymer is preferable. The aromatic vinyl compound-conjugated diene block copolymer is a block copolymer having a polymer block [A] in which a main component is an aromatic vinyl compound unit, and a polymer block [B] in which a main component is a linear conjugated diene compound unit. The aromatic vinyl compound unit is a structural unit having a structure that is formed by polymerization of an aromatic vinyl compound. The linear conjugated diene compound unit is a structural unit having a structure that is formed by polymerization of a linear conjugated diene compound. The block copolymer and the hydride thereof may be those which is modified with, e.g., alkoxysilane, carboxylic acid, or carboxylic acid anhydride.

In particular, it is preferable that the elastomer that is used as the material of the adhesive layer is a hydride formed by hydrogenating a specific block copolymer having two or more polymer blocks [A] per molecule of the copolymer, and one or more polymer blocks [B] per molecule of the copolymer, the block [A] having as a main component the aromatic vinyl compound unit, and the block [B] having as a main component the linear conjugated diene compound unit. The hydride formed by hydrogenating the specific block copolymer will be described hereinbelow.

(Specific Block Copolymer)

As described above, the polymer block [A] that the specific block copolymer includes has the aromatic vinyl compound unit. Examples of the aromatic vinyl compound corresponding to the aromatic vinyl compound unit that the polymer block [A] has may include styrene, α-methylstyrene, 2-methylstyrene, 3-methylstyrene, 4-methylstyrene, 2,4-diisopropylstyrene, 2,4-dimethylstyrene, 4-t-butylstyrene, 5-t-butyl-2-methylstyrene, 4-monochlorostyrene, dichlorostyrene, 4-monofluorostyrene, and 4-phenylstyrene. One type thereof may be solely used, and two or more types thereof may also be used in combination at any ratio. Among them, aromatic vinyl compounds containing no polar group are preferable in terms of hygroscopic property. Furthermore, styrene is particularly preferable in the viewpoint of industrial availability and impact resistance.

The containing ratio of the aromatic vinyl compound unit in the polymer block [A] is usually equal to or higher than 90% by weight, preferably equal to or higher than 95% by weight, and more preferably equal to or higher than 99% by weight. By having such a large amount of the aromatic vinyl compound unit in the polymer block [A], heat resistance of the adhesive layer can be enhanced.

The polymer block [A] may contain an optional structural unit in addition to the aromatic vinyl compound unit. Examples of the optional structural unit may include linear conjugated diene compound unit and a structural unit having a structure that is formed by polymerization of a vinyl compound other than the aromatic vinyl compound.

Examples of the linear conjugated diene compound corresponding to the linear conjugated diene compound unit may include those that are the same as examples of linear conjugated diene compound corresponding to the linear conjugated diene compound unit that the polymer block [B] has. As the linear conjugated diene compound, one type thereof may be solely used, and two or more types thereof may also be used in combination at any ratio.

Examples of the vinyl compound other than the aromatic vinyl compound may include linear vinyl compounds; cyclic vinyl compounds; vinyl compounds having a nitrile group, an alkoxycarbonyl group, a hydroxycarbonyl group, or a halogen group; unsaturated cyclic acid anhydrides; and unsaturated imide compounds. Among them, in terms of hygroscopic property, preferable are those containing no polar group, including linear olefins such as ethylene, propylene, 1-butene, 1-pentene, 1-hexene, 1-heptene, 1-octene, 1-nonene, 1-decene, 1-dodecene, 1-eicosene, 4-methyl-1-pentene, and 4,6-dimethyl-1-heptene; and cyclic olefins such as vinylcyclohexane. In particular, the linear olefins are more preferable, and ethylene and propylene are particularly preferable. One type thereof may be solely used, and two or more types thereof may also be used in combination at any ratio.

The containing ratio of the optional structural unit in the polymer block [A] is usually equal to or lower than 10% by weight, preferably equal to or lower than 5% by weight, and more preferably equal to or lower than 1% by weight.

The number of polymer blocks [A] per molecule of the block copolymer is usually two or more, and usually five or less, preferably four or less, and more preferably three or less. The polymer blocks [A] two or more of which exist in one molecule may be the same as or different from one another.

When a plurality of different polymer blocks [A] are present in one molecule of the block copolymer, the weight-average molecular weight of the polymer block having a maximum weight-average molecular weight among the polymer blocks [A] is defined as Mw(A1) and the weight-average molecular weight of the polymer block having a minimum weight-average molecular weight is defined as Mw(A2). In this case, a ratio between Mw(A1) and Mw(A2) "Mw(A1)/Mw(A2)" is preferably equal to or lower than 2.0, more preferably equal to or lower than 1.5, and particularly preferably equal to or lower than 1.2. By having the ratio in this range, fluctuation in values of properties of various types can be reduced.

The polymer block [B] that the block copolymer includes has the linear conjugated diene compound unit. Examples of the linear conjugated diene compound corresponding to the linear conjugated diene compound unit that the polymer block [B] has may include 1,3-butadiene, isoprene, 2,3-dimethyl-1,3-butadiene, and 1,3-pentadiene. One type thereof may be solely used, and two or more types thereof may also be used in combination at any ratio. Among them, the linear conjugated diene compound containing no polar group is preferable in terms of hygroscopic property and 1,3-butadiene and isoprene are particularly preferable.

The containing ratio of the linear conjugated diene compound unit in the polymer block [B] is usually equal to or higher than 90% by weight, preferably equal to or higher than 95% by weight, and more preferably equal to or higher than 99% by weight. By having such a large amount of the linear conjugated diene compound unit in the polymer block [B], impact resistance of the adhesive layer at a low temperature can be improved.

The polymer block [B] may contain an optional structural unit in addition to the linear conjugated diene compound unit. Examples of the optional structural unit may include an aromatic vinyl compound unit and a structural unit having a structure that is formed by polymerization of a vinyl compound other than the aromatic vinyl compound. Examples of the aromatic vinyl compound unit and the structural unit having the structure that is formed by polymerization of a vinyl compound other than the aromatic vinyl compound may include those exemplified as those that may be contained in the polymer block [A].

The containing ratio of the optional structural unit in the polymer block [B] is usually equal to or lower than 10% by weight, preferably equal to or lower than 5% by weight, and more preferably equal to or lower than 1% by weight. In particular, by lowering the containing ratio of the aromatic vinyl compound unit in the polymer block [B], flexibility of the adhesive layer at a low temperature can be improved and impact resistance of the adhesive layer at a low temperature can thus be improved.

The number of polymer blocks [B] in one molecule of the block copolymer is usually one or more but may be two or more. When the number of polymer blocks [B] in the block copolymer is two or more, the polymer blocks [B] may be the same as or different from one another.

When a plurality of different polymer blocks [B] are present in one molecule of the block copolymer, the weight-average molecular weight of the polymer block having a maximum weight-average molecular weight among the polymer blocks [B] is defined as Mw(B1) and the weight-average molecular weight of the polymer block having a minimum weight-average molecular weight is defined as Mw(B2). In this case, a ratio between Mw(B1) and Mw(B2) "Mw(B1)/Mw(B2)" is preferably equal to or lower than 2.0, more preferably equal to or lower than 1.5, and particularly preferably equal to or lower than 1.2. By having the ratio in this range, fluctuation in values of properties of various types can be reduced.

The block form of the block copolymer may be a linear block or a radial block. In particular, the linear block has excellent mechanical strength and is therefore preferable.

When the block copolymer has a form of the linear block, it is preferable that both ends thereof are the polymer blocks [A] because stickiness of the elastomer resin can be reduced to a desired low value.

A particularly preferable block form of the block copolymer is a triblock copolymer in which the polymer blocks [A] bond to both ends of the polymer block [B]; and a pentablock copolymer in which the polymer blocks [B] bond to both ends of the polymer block [A] and the polymer blocks [A] bond to the other ends of both the polymer blocks [B]. In particular, the triblock copolymer of [A]-[B]-[A] is particularly preferable because it can be manufactured easily and properties such as viscosity can be set to be in desired ranges.

In the block copolymer, a ratio between a weight fraction wA of all the polymer blocks [A] in the entire block copolymer and a weight fraction wB of all the polymer blocks [B] in the entire block copolymer (wA/wB) is usually equal to or higher than 20/80 and preferably equal to or higher than 30/70, and usually equal to or lower than 60/40 and preferably equal to or lower than 55/45. By setting the above-mentioned ratio wA/wB to be equal to or higher than the lower limit of the above-mentioned range, heat resistance of the adhesive layer can be improved. By setting the above-mentioned ratio wA/wB to be equal to or lower than the upper limit of the above-mentioned range, flexibility of the adhesive layer can be enhanced and barrier property of the adhesive layer can be stably maintained preferably. Further, the glass transition temperature of the block copolymer can thereby be lowered and in turn the sealing temperature can be lowered. Consequently, heat deterioration of the elements such as the organic EL elements and the organic semiconductor elements can be suppressed.

The weight-average molecular weight (Mw) of the above-mentioned block copolymer is usually equal to or larger than 30,000, preferably equal to or larger than 40,000, and more preferably equal to or larger than 50,000, and usually equal to or smaller than 200,000, preferably equal to or smaller than 150,000, and more preferably equal to or smaller than 100,000. The weight-average molecular weight of the block copolymer may be measured as a value in terms of polystyrene by the gel permeation chromatography (GPC) using tetrahydrofuran (THF) as a solvent.

The molecular weight distribution (Mw/Mn) of the block copolymer is preferably equal to or lower than 3, more preferably equal to or lower than 2, and particularly preferably equal to or lower than 1.5, and preferably equal to or higher than 1.0. Mn represents a number-average molecular weight.

When the block copolymer having three polymer blocks is manufactured, examples of the method for manufacturing the block copolymer may include the following manufacturing methods 1 and 2. A material that is referred to as a "monomer composition" encompasses not only a mixture of substances of two or more types but also a material consisting of a single substance.

(Manufacturing Method 1)

A method including:

a first step of polymerizing a monomer composition (a1) containing the aromatic vinyl compound, to form the polymer block [A];

a second step of polymerizing a monomer composition (b1) containing the linear conjugated diene compound to form the polymer block [B] on one end of the polymer block [A], to form a [A]-[B] diblock polymer; and a third step of polymerizing a monomer composition (a2) containing the aromatic vinyl compound on a terminal end of the diblock polymer at the polymer block [B] side, to obtain the block copolymer. The monomer composition (a1) and the monomer composition (a2) may be the same. They may also be different from each other.

(Manufacturing Method 2)

A method including:

a first step of polymerizing a monomer composition (a1) containing the aromatic vinyl compound, to form the polymer block [A];

a second step of polymerizing a monomer composition (b1) containing the linear conjugated diene compound to form the polymer block [B] on one end of the polymer block [A], to form a [A]-[B] diblock polymer; and a third step of coupling terminal ends of the diblock polymers at the polymer block [B] side with a coupling agent, to obtain the block copolymer.

Examples of the methods that may be used for polymerizing the monomer compositions to obtain each polymer block may include radical polymerization, anion polymerization, cation polymerization, coordination anion polymerization, and coordination cation polymerization. From the viewpoint of facilitating polymerization operation and hydrogenation reaction in a subsequent step, it is preferable to perform the radical polymerization, the anion polymerization, the cation polymerization, or the like by living polymerization. It is particularly preferable to perform living anion polymerization.

The above-mentioned polymerization of the monomer compositions may be performed in a temperature range of usually equal to or higher than 0° C., preferably equal to or higher than 10° C., and more preferably equal to or higher than 20° C., and usually equal to or lower than 100° C., preferably equal to or lower than 80° C., and more preferably equal to or lower than 70° C. in the presence of a polymerization initiator.

When the living anion polymerization is performed, examples of the polymerization initiator for use may include mono organic lithium such as n-butyllithium, sec-butyllithium, t-butyllithium, and hexyllithium; or polyfunctional organic lithium compound such as dilithiomethane, 1,4-dilithiobutane, and 1,4-dilithio-2-ethylcyclohexane. One type thereof may be solely used, and two or more types thereof may also be used in combination at any ratio.

As a form of the polymerization reaction, e.g., solution polymerization or slurry polymerization may be used. In particular, use of the solution polymerization facilitates removal of reaction heat.

When the solution polymerization is performed, an inactive solvent capable of dissolving therein the polymer obtained in the respective steps may be used. Examples of the inactive solvent may include aliphatic hydrocarbons such as n-pentane, isopentane, n-hexane, n-heptane, and isooctane; alicyclic hydrocarbons such as cyclopentane, cyclohexane, methylcyclopentane, methylcyclohexane, and decalin; and aromatic hydrocarbons such as benzene and toluene. One type thereof may be solely used, and two or more types thereof may also be used in combination at any ratio. Among them, use of the alicyclic hydrocarbon as the solvent is preferable because the alicyclic hydrocarbon can be used as it is as the inactive solvent for the hydrogenation reaction and has preferable solubility of the block copolymer. The using amount of the solvent is usually 200 parts by weight to 2,000 parts by weight with respect to 100 parts by weight of all the used monomers.

When each monomer composition contains monomers of two or more types, e.g., a randomizer may be used for preventing elongation of only a chain of certain one component. In particular, when the polymerization reaction is performed by the anion polymerization, e.g., Lewis base compound is preferably used as the randomizer. Examples of the Lewis base compound may include ether compounds such as dimethyl ether, diethyl ether, diisopropyl ether, dibutyl ether, tetrahydrofuran, diphenyl ether, ethylene glycol diethyl ether, and ethylene glycol methyl phenyl ether; tertiary amine compounds such as tetramethylethylenediamine, trimethylamine, triethylamine, and pyridine; alkali metal alkoxide compounds such as potassium-t-amyl oxide and potassium-t-butyl oxide; and phosphine compounds such as triphenylphosphine. One type thereof may be solely used, and two or more types thereof may also be used in combination at any ratio.

(Hydride of Specific Block Copolymer)

It is preferable to use the hydride of the above-mentioned specific block copolymer as the elastomer that is the material of the adhesive layer of the sealing film according to the present invention. By using a hydrogenated product of the specific block copolymer, the amount of outgas generation from the adhesive layer can be further reduced.

The hydride of the block copolymer is a product obtained by hydrogenating unsaturated bonds of the above-mentioned specific block copolymer. The unsaturated bonds of the block copolymer include both of aromatic and non-aromatic carbon-carbon unsaturated bonds in a main chain and side chains of the block copolymer. The hydrogenation rate is usually equal to or higher than 90%, preferably equal to or higher than 97%, and more preferably equal to or higher than 99% of all the unsaturated bonds of the block copolymer. As the hydrogenation rate is higher, heat resistance and light resistance of the adhesive layer can be made preferable. The hydrogenation rate of the hydride may be calculated by $^{1}$H-NMR measurement.

In particular, the hydrogenation rate of the non-aromatic unsaturated bonds is preferably equal to or higher than 95% and is more preferably equal to or higher than 99%. With high hydrogenation rate of the non-aromatic carbon-carbon unsaturated bonds, light resistance and oxidation resistance of the adhesive layer can be further enhanced.

The hydrogenation rate of the aromatic carbon-carbon unsaturated bonds is preferably equal to or higher than 90%, more preferably equal to or higher than 93%, and particularly preferably equal to or higher than 95%. With high hydrogenation rate of the carbon-carbon unsaturated bonds of aromatic rings, glass transition temperature of the polymer blocks obtained by hydrogenating the polymer blocks [A] is increased. Consequently, heat resistance of the adhesive layer can be effectively enhanced. Furthermore, the photoelastic coefficient of the adhesive layer can be lowered, and occurrence of the retardation during the adhesion can thereby be reduced.

The weight-average molecular weight (Mw) of the hydride of the block copolymer is usually equal to or larger than 30,000, preferably equal to or larger than 40,000, and more preferably equal to or larger than 45,000, and usually equal to or smaller than 200,000, preferably equal to or smaller than 150,000, and more preferably equal to or smaller than 100,000. The weight-average molecular weight of the hydride of the block copolymer may be measured as a value in terms of polystyrene by the gel permeation chromatography using tetrahydrofuran as a solvent. The molecular weight distribution (Mw/Mn) of the hydride of the block copolymer is preferably equal to or lower than 3, more preferably equal to or lower than 2, and particularly preferably equal to or lower than 1.5, and preferably equal to or higher than 1.0. By setting the weight-average molecular weight Mw and the molecular weight distribution Mw/Mn of the hydride of the block copolymer to be within the above-mentioned ranges, the mechanical strength and the heat resistance of the adhesive layer can be improved.

In the hydride of the block copolymer, a ratio between a weight fraction wA of all the polymer blocks [A] in the entire block copolymer and a weight fraction wB of all the polymer blocks [B] in the entire block copolymer (wA/wB) is usually the same as the value of the ratio wA/wB in the block copolymer before hydrogenation.

It is preferable that the hydride of the block copolymer has an alkoxysilyl group in the molecular structure thereof. The hydride of the block copolymer that has the alkoxysilyl group may be obtained by, e.g., bonding the alkoxysilyl group to the hydride of the block copolymer that does not have the alkoxysilyl group. The bonding may be effected by directly bonding the alkoxysilyl group to the hydride of the block copolymer, and may also be effected by bonding the group via a bivalent organic group such as an alkylene group.

The hydride of the block copolymer that has the alkoxysilyl group is particularly excellent in adhesiveness to a material such as glass, an inorganic substance, and metal. The adhesiveness between the adhesive layer and the elements can therefore be enhanced particularly when the sealing film of the present invention seals the elements of the organic electronic device. Accordingly, the adhesive layer can keep sufficient adhesion force for a long period of time even after it is exposed to a high temperature and high humidity environment under which reliability evaluation of the organic electronic device is usually performed.

The amount of introducing the alkoxysilyl group is usually equal to or larger than 0.1 part by weight, preferably equal to or larger than 0.2 part by weight, and more preferably equal to or larger than 0.3 part by weight, and usually equal to or smaller than 10 parts by weight, preferably equal to or smaller than 5 parts by weight, and more preferably equal to or smaller than 3 parts by weight with respect to 100 parts by weight of the hydride of the block copolymer before the introduction of the alkoxysilyl group.

By setting the introduction amount of the alkoxysilyl group to be within the above-mentioned range, crosslinking degree between the alkoxysilyl groups decomposed with water or the like can be prevented from being excessively increased, whereby the adhesiveness of the adhesive layer can be kept at a high level.

The introduction amount of the alkoxysilyl group may be measured by $^1$H-NMR spectrometry. When the introduction amount is small, the measurement of the alkoxysilyl group introduction amount may be performed by increasing the number of times of cumulation.

Usually, the molecular weight of the hydride of the block copolymer that has the alkoxysilyl group is not largely altered from the molecular weight of the hydride of the block copolymer before the introduction of the alkoxysilyl group because the amount of the alkoxysilyl group that is introduced is small. However, upon the introduction of the alkoxysilyl group, modification reaction of the hydride of the block copolymer is performed in the presence of a peroxide. With this modification reaction, crosslinking reaction and cleavage reaction of the hydride proceed and the molecular weight distribution tends to be largely altered. The weight-average molecular weight of the hydride of the block copolymer that has the alkoxysilyl group is usually equal to or larger than 30,000, preferably equal to or larger than 40,000, and more preferably equal to or larger than 50,000, and usually equal to or smaller than 200,000, preferably equal to or smaller than 150,000, and more preferably equal to or smaller than 120,000. The weight-average molecular weight of the hydride of the block copolymer that has the alkoxysilyl group may be measured as a value in terms of polystyrene by the gel permeation chromatography using tetrahydrofuran as a solvent. The molecular weight distribution (Mw/Mn) of the hydride of the block copolymer that has the alkoxysilyl group is usually equal to or lower than 3.5, preferably equal to or lower than 2.5, and particularly preferably equal to or lower than 2.0, and preferably equal to or higher than 1.0. When the weight-average molecular weight Mw and the molecular weight distribution Mw/Mn of the hydride of the block copolymer that has the alkoxysilyl group are within the above-mentioned ranges, preferable mechanical strength and tensile stretching of the adhesive layer can be retained.

The method for manufacturing the hydride of the block copolymer as mentioned above usually includes hydrogenation of the above-mentioned specific block copolymer. As the hydrogenation method, a hydrogenation method capable of increasing the hydrogenation rate with less chain cleavage reaction of the block copolymer is preferable. Examples of the preferable hydrogenation method may include a hydrogenation method using a hydrogenation catalyst containing at least one species of metal selected from a group consisting of nickel, cobalt, iron, titanium, rhodium, palladium, platinum, ruthenium, and rhenium. As the hydrogenation catalyst, one type thereof may be solely used, and two or more types thereof may also be used in combination at any ratio. As the hydrogenation catalyst, any of a heterogeneous catalyst and a homogeneous catalyst may be used. It is preferable to perform the hydrogenation reaction in an organic solvent.

The heterogeneous catalyst may be used in a form of metal or metal compound as it is, and may also be used while being carried on an appropriate carrier. Examples of the carrier may include activated carbon, silica, alumina, calcium carbonate, titania, magnesia, zirconia, diatomite, silicon carbide, and calcium fluoride. The catalyst carrying amount is usually equal to or higher than 0.1% by weight and preferably equal to or higher than 1% by weight, and usually equal to or lower than 60% by weight and preferably equal to or lower than 50% by weight with respect to the total amount of the catalyst and the carrier. The specific surface area of the carried-type catalyst is preferably 100 $m^2/g$ to 500 $m^2/g$. The average pore diameter of the carried-type catalyst is preferably equal to or larger than 100 Å and more preferably equal to or larger than 200 Å, and preferably equal to or smaller than 1,000 Å and preferably equal to or smaller than 500 Å. The specific surface area may be obtained by calculating a measurement of a nitrogen adsorption amount with a BET equation. The average pore diameter may be measured by a mercury penetration method.

As the homogeneous catalyst, e.g., a catalyst formed by combining compound of nickel, cobalt, titanium, or iron and organometallic compound, or an organometallic complex catalyst of rhodium, palladium, platinum, ruthenium, rhenium, or the like may be used.

Examples of the compound of nickel, cobalt, titanium, or iron may include acetylacetonate compounds, carboxylic acid salts, and cyclopentadienyl compounds of each metal.

Examples of the organometallic compound may include organic aluminum compounds including alkyl aluminum such as triethylaluminum and triisobutylaluminum, aluminum halide such as diethylaluminum chloride and ethylaluminum dichloride, and alkyl aluminum hydride such as diisobutylaluminum hydride, and organic lithium compounds.

Examples of the organometallic complex catalyst may include transition metal complexes such as dihydride-tetrakis(triphenylphosphine)ruthenium, dihydride-tetrakis(triphenylphosphine)iron, bis(cyclooctadiene)nickel, and bis(cyclopentadienyl)nickel.

The using amount of the hydrogenation catalyst is usually equal to or larger than 0.01 part by weight, preferably equal to or larger than 0.05 part by weight, and more preferably equal to or larger than 0.1 part by weight, and usually equal to or smaller than 100 parts by weight, preferably equal to or smaller than 50 parts by weight, and more preferably equal to or smaller than 30 parts by weight with respect to 100 parts by weight of the block copolymer.

The temperature of the hydrogenation reaction is usually equal to or higher than 10° C., preferably equal to or higher than 50° C., and more preferably equal to or higher than 80° C., and usually equal to or lower than 250° C., preferably equal to or lower than 200° C., and more preferably equal to or lower than 180° C. By performing the hydrogenation reaction in such a temperature range, hydrogenation rate can be increased and molecular cleavage of the block copolymer can be reduced.

Furthermore, the hydrogen pressure applied during the hydrogenation reaction is usually equal to or higher than 0.1 MPa, preferably equal to or higher than 1 MPa, and more preferably equal to or higher than 2 MPa, and usually equal to or lower than 30 MPa, preferably equal to or lower than 20 MPa, and more preferably equal to or lower than 10 MPa. By performing the hydrogenation reaction at such a hydrogen pressure, hydrogenation rate can be increased and molecular chain cleavage of the block copolymer can be reduced, resulting in preferable operability.

As a result of the above-described hydrogenation of the block copolymer, a hydride of the block copolymer may be obtained as a product. The product after the hydrogenation reaction may be used as it is. Alternatively, if necessary, the product after the hydrogenation reaction may be subjected to any processing before using. For example, if necessary, processing of introducing the alkoxysilyl group may be performed on the product after the hydrogenation reaction.

As the method for introducing the alkoxysilyl group to the hydride of the block copolymer, e.g., a method in which the hydride of the block copolymer before the introduction of the alkoxysilyl group and ethylenic unsaturated silane compound are reacted in the presence of a peroxide may be used.

As the ethylenic unsaturated silane compound, those which are capable of making graft polymerization with the hydride of the block copolymer and introducing the alkoxysilyl group to the hydride of the block copolymer may be used. Examples of the ethylenic unsaturated silane compound may include vinyltrimethoxysilane, vinyltriethoxysilane, allyltrimethoxysilane, allyltriethoxysilane, dimethoxymethylvinylsilane, diethoxymethylvinylsilane, p-styryltrimethoxysilane, p-styryltriethoxysilane, 3-methacryloxypropyltrimethoxysilane, 3-methacryloxypropylmethyldimethoxysilane, 3-methacryloxypropyltriethoxysilane, 3-methacryloxypropylmethyldiethoxysilane, 3-acryloxypropyltrimethoxysilane, 3-acryloxypropyltriethoxysilane, and 2-norbornene-5-yltrimethoxysilane. Among them, vinyltrimethoxysilane, vinyltriethoxysilane, allyltrimethoxysilane, allyltriethoxysilane, dimethoxymethylvinylsilane, diethoxymethylvinylsilane, and p-styryltrimethoxysilane are preferable. As the ethylenic unsaturated silane compound, one type thereof may be solely used, and two or more types thereof may also be used in combination at any ratio.

The amount of the ethylenic unsaturated silane compound is usually equal to or larger than 0.1 part by weight, preferably equal to or larger than 0.2 part by weight, and more preferably equal to or larger than 0.3 part by weight, and usually equal to or smaller than 10 parts by weight, preferably equal to or smaller than 5 parts by weight, and more preferably equal to or smaller than 3 parts by weight with respect to 100 parts by weight of the hydride of the block copolymer before the introduction of the alkoxysilyl group.

Examples of the peroxide may include organic peroxides such as dibenzoyl peroxide, t-butyl peroxyacetate, 2,2-di-(t-butylperoxy)butane, t-butyl peroxybenzoate, t-butyl cumyl peroxide, dicumyl peroxide, di-t-hexylperoxide, 2,5-dimethyl-2,5-di-(t-butyl peroxyhexane), di-t-butyl peroxide, 2,5-dimethyl-2,5-di-(t-butyl peroxy)hexane-3, t-butyl hydroperoxide, t-butyl peroxyisobutyrate, lauroyl peroxide, dipropionyl peroxide, and p-menthane hydroperoxide. Among them, those having a one-minute half-life temperature of 170° C. to 190° C. are preferable and, e.g., t-butyl cumyl peroxide, dicumyl peroxide, di-t-hexylperoxide, 2,5-dimethyl-2,5-di-(t-butyl peroxyhexane), and di-t-butyl peroxide are preferable. As the peroxide, one type thereof may be solely used, and two or more types thereof may also be used in combination at any ratio.

The amount of the peroxide is usually equal to or larger than 0.01 part by weight, preferably equal to or larger than 0.2 part by weight, and more preferably equal to or larger than 0.3 part by weight, and usually equal to or smaller than 5 parts by weight, preferably equal to or smaller than 3 parts by weight, and more preferably equal to or smaller than 2 parts by weight with respect to 100 parts by weight of the hydride of the block copolymer before the introduction of the alkoxysilyl group.

The reaction of the hydride of the block copolymer and the ethylenic unsaturated silane compound in the presence of peroxide may be performed using, e.g., a heating kneader and a reactor vessel. As a specific example, a mixture of the hydride of the block copolymer, the ethylenic unsaturated silane compound, and the peroxide is heated and melted at a temperature of equal to or higher than the melting temperature of the hydride of the block copolymer and is kneaded for a desired period of time by a twin-screw kneading machine. With this process, the alkoxysilyl group can be introduced to the hydride of the block copolymer. The specific temperature is usually equal to or higher than 180° C., preferably equal to or higher than 190° C., and more preferably equal to or higher than 200° C., and usually equal to or lower than 240° C., preferably equal to or lower than 230° C., and more preferably equal to or lower than 220° C. Furthermore, the heating and kneading time is usually equal to or longer than 0.1 minute, preferably equal to or longer than 0.2 minute, and more preferably equal to or longer than 0.3 minute, and usually equal to or shorter than 15 minutes, preferably equal to or shorter than 10 minutes, and more preferably equal to or shorter than 5 minutes. When continuous kneading facility such as a twin-screw kneading machine and a single-screw extruder is used, kneading and extrusion may be continuously performed such that the retention time is within the above-mentioned range.

The above-mentioned method usually provides the hydride of the block copolymer as a reaction solution containing the hydride of the block copolymer, the hydrogenation catalyst, and a polymerization catalyst. The hydride of the block copolymer may be collected from the reaction solution after the hydrogenation catalyst and the polymerization catalyst are removed from the reaction solution by a method such as filtration and centrifugal separation. Examples of the method for collecting the hydride of the block copolymer from the reaction solution may include a steam coagulation method of removing the solvent from the solution containing the hydride of the block copolymer dissolved therein by steam stripping; a direct solvent removal method of removing the solvent by heating under reduced pressure; and a coagulation method of precipitating and coagulating the hydride of the block copolymer by pouring the solution into a poor solvent of the hydride of the block copolymer.

The form of the collected hydride of the block copolymer is preferably a form of pellets for improving availability to the subsequent molding processing or modification reaction. For example, when the hydride of the block copolymer is collected from the reaction solution by the direct solvent removal method, the hydride in a melted state may be extruded into a strand form from a die and cooled. The strand may be cut into a form of pellets by a pelletizer to be subjected to a variety of molding. When the coagulation method is used, the coagulant thus obtained may be dried, and the coagulant in the melted state may then be extruded by an extruder, and processed to be in a form of pellets in the same manner as mentioned above, to be subjected to a variety of molding.

4.1.2. Optional Components

Examples of the optional component that the elastomer resin for use as the material of the adhesive layer may contain may include a plasticizer for adjusting the glass transition temperature and the elasticity, and a light stabilizer for improving weather resistance and heat resistance, an ultraviolet absorbent, an antioxidant, a lubricant, and an inorganic filler. As the optional component, one type thereof may be solely used, and two or more types thereof may also be used in combination at any ratio.

Examples of the plasticizer for adjusting the glass transition temperature and the flexibility may include polyisobutene, hydrogenated polyisobutene, hydrogenated polyisoprene, hydrogenated 1,3-pentadiene-based petroleum resin, hydrogenated cyclopentadiene-based petroleum resin, and hydrogenated styrene-indene petroleum resin. The adding amount of the plasticizer is appropriately selected in accordance with the purpose for adjusting resin properties in a range of usually equal to or smaller than 40 parts by weight with respect to 100 parts by weight of the elastomer resin.

As the light stabilizer, a hindered amine-based light stabilizer is preferable and compounds having, e.g., a 3,5-di-t-butyl-4-hydroxyphenyl group, a 2,2,6,6-tetramethylpiperidyl group, or a 1,2,2,6,6-pentamethyl-4-piperidyl group in a structure is particularly preferable.

Specific examples of the light stabilizer may include a mixed esterification product of 1,2,3,4-butanetetracarboxylic acid with 1,2,2,6,6-pentamethyl-4-piperidinol, and 3,9-bis(2-hydroxy-1,1-dimethylethyl)-2,4,8,10-tetraoxaspiro[5,5]undecane, polycondensate of 1,6-hexanediamine-N,N'-bis(2,2,6,6-tetramethyl-4-piperidyl) and morpholine-2,4,6-trichloro-1,3,5-triazine, 1-[2-[3-(3,5-di-t-butyl-4-hydroxyphenyl)propionyloxy]ethyl]-4-[3-3,5-di-t-butyl-4-hydroxyphenyl)propionyloxy]-2,2,6,6-tetramethylpiperidine, 2-(3,5-di-t-butyl-4-hydroxybenzyl)-2-n-butylmalonic acid-bis-(1,2,2,6,6-pentamethyl-4-piperidyl), 2-(3,5-di-t-butyl-4-hydroxybenzyl)-2-n-butylmalonic acid-bis-(1,2,2,6,6-pentamethyl-4-piperidyl), 4-(3-(3,5-di-t-butyl-4-hydroxyphenyl)propionyloxy)-1-(2-(3-(3,5-di-t-butyl-4-hydroxyphenyl)propionyloxy)ethyl)-2,2,6,6-tetramethylpiperidine, 4-(N-(1-benzyl-2-phenylethyl)-N-formylamino)-2,2,6,6-tetramethylpiperidine, 4-(N-(2-(1-pyrrolidyl)ethyl)-N-formylamino)-2,2,6,6-tetramethylpiperidine, 4-(N-(2-(4-morpholinyl)ethyl)-N-formylamino)-2,2,6,6-tetramethyl-N-methylpiperidine, 4-(N-(2-(4-morpholinyl)ethyl)-N-formylamino)-2,2,6,6-tetramethylpiperidine, 4-(N-(2-(diisopropylamino)ethyl)-N-formylamino)-2,2,6,6-tetramethylpiperidine, 4-(N-(2,4,6-trimethylbenzyl)-N-formylamino)-2,2,6,6-tetramethylpiperidine, 4-(N-(3-(2-ethylhexoxy)propyl)-N-formylamino)-2,2,6,6-tetramethylpiperidine, 4-(N-(3,4-(methylenedioxy)benzyl)-N-formylamino)-2,2,6,6-tetramethylpiperidine, 4-(N-(bicyclo[2.2.1]heptyl)-N-formylamino)-2,2,6,6-tetramethylpiperidine, 4-(N-1,2,2-trimethylpropyl-N-formylamino)-2,2,6,6-tetramethylpiperidine, 4-(N-1,3-dimethylbutyl-N-formylamino)-2,2,6,6-tetramethylpiperidine, 4-(N-1-benzylethyl-N-formylamino)-2,2,6,6-tetramethylpiperidine, 4-(N-2,2-dimethylpropyl-N-formylamino)-2,2,6,6-tetramethylpiperidine, 4-(N-2-ethylhexyl-N-formylamino)-2,2,6,6-tetramethylpiperidine, 4-(N-3-methylbutyl-N-formylamino)-2,2,6,6-tetramethylpiperidine, 4-(N-4-hydroxybutyl-N-formylamino)-2,2,6,6-tetramethylpiperidine, 4-(N-4-hydroxybutyl-N-formylamino)-2,2,6,6-tetramethylpiperidine, 4-(N-i-propyl-N-formylamino)-2,2,6,6-tetramethylpiperidine, 4-(N-i-propyl-N-formylamino)-2,2,6,6-tetramethylpiperidine, 4-(N-t-butyl-N-formylamino)-2,2,6,6-tetramethylpiperidine, 4-(N-isopropylbenzyl-N-formylamino)-2,2,6,6-tetramethylpiperidine, 4-(N-ethoxyethyl-N-formylamino)-2,2,6,6-tetramethylpiperidine, 4-(N-ethoxypropyl-N-formylamino)-2,2,6,6-tetramethylpiperidine, 4-(N-octadecyl-N-formylamino)-2,2,6,6-tetramethylpiperidine, 4-(N-octyl-N-formylamino)-2,2,6,6-tetramethyl-N-methylpiperidine, 4-(N-octyl-N-formylamino)-2,2,6,6-tetramethylpiperidine, 4-(N-chlorobenzyl-N-formylamino)-2,2,6,6-tetramethylpiperidine, 4-(N-diethylaminoethyl-N-formylamino)-2,2,6,6-tetramethylpiperidine, 4-(N-cyclododecyl-N-formylamino)-2,2,6,6-tetramethylpiperidine, 4-(N-cyclohexyl-N-formylamino)-2,2,6,6-tetramethyl-N-methylcarbonylpiperidine, 4-(N-cyclohexyl-N-formylamino)-2,2,6,6-tetramethyl-N-methylpyridine, 4-(N-cyclohexyl-N-formylamino)-2,2,6,6-tetramethylpyridine, 4-(N-cyclopentyl-N-formylamino)-2,2,6,6-tetramethyl-N-methylpiperidine, 4-(N-cyclopentyl-N-formylamino)-2,2,6,6-tetramethylpiperidine, 4-(N-dimethylaminopropyl-N-formylamino)-2,2,6,6-tetramethylpiperidine, 4-(N-decyl-N-formylamino)-2,2,6,6-tetramethyl-N-methylpiperidine, 4-(N-decyl-N-formylamino)-2,2,6,6-tetramethylpiperidine, 4-(N-dodecyl-N-formylamino)-2,2,6,6-tetramethylpiperidine, 4-(N-pyridinylmethyl-N-formylamino)-2,2,6,6-tetramethylpiperidine, 4-(N-phenylethyl-N-formylamino)-2,2,6,6-tetramethyl-N-methylpyridine, 4-(N-phenylethyl-N-formylamino)-2,2,6,6-tetramethylpyridine, 4-(N-butyl-N-formylamino)-2,2,6,6-tetramethyl-N-methylpiperidine, 4-(N-butyl-N-formylamino)-2,2,6,6-tetramethyl-N-methylpiperidine, 4-(N-fluorobenzyl-N-formylamino)-2,2,6,6-tetramethylpiperidine, 4-(N-hexyl-N-formylamino)-2,2,6,6-tetramethyl-N-methylpiperidine, 4-(N-hexyl-N-formylamino)-2,2,6,6-tetramethylpiperidine, 4-(N-pentyl-N-formylamino)-2,2,6,6-tetramethyl-N-methylpiperidine, 4-(N-pentyl-N-formylamino)-2,2,6,6-tetramethylpiperidine, 4-(N-methylcyclohexyl-N-formylamino)-2,2,6,6-tetramethylpyridine, 4-(N-methylbenzyl-N-formylamino)-2,2,6,6-tetramethylpiperidine, 4-(N-methoxybenzyl-N-formylamino)-2,2,6,6-tetramethylpiperidine, 4-(formylamino)-2,2,6,6-tetramethyl-N-methylpiperidine, 4-(formylamino)-2,2,6,6-tetramethylpiperidine, 4-[N-(2,2,6,6-tetramethyl-4-piperidyl)-N-formylamino]-2,2,6,6-tetramethyl-N-methylpyridine, 4-[N-(2,2,6,6-tetramethyl-4-piperidyl)-N-formylamino]-2,2,6,6-tetramethylpyridine, N,N',N'',N'''-tetrakis-(4,6-bis(butyl-(N-methyl-2,2,6,6-tetramethylpiperidine-4-yl)amino)-triazine-2-yl)-4,7-diazadecane-1,10-amine, N,N'-bis(2,2,6,6-tetramethyl-4-N-methylpiperidyl)-N,N'-diformyl-1,4-xylylenediamine, N,N'-bis(2,2,6,6-tetramethyl-4-N-methylpiperidyl)-N,N'-diformyl-trimethylenediamine, N,N'-bis(2,2,6,6-tetramethyl-4-N-methylpiperidyl)-N,N'-diformyl-hexamethylenediamine, N,N'-bis(2,2,6,6-tetramethyl-4-N-methylpiperidyl)-N,N'-diformylethylenediamine, N,N'-bis(2,2,6,6-tetramethyl-4-piperidyl)-N,N'-diformyl-1,4-xylylenediamine, N,N'-bis(2,2,6,6-tetramethyl-4-piperidyl)-N,N'-diformylethylenediamine, N,N'-bis(2,2,6,6-tetramethyl-4-piperidyl)-N,N'-diformyl-trimethylenediamine, N,N'-bis(2,2,6,6-tetramethyl-4-piperidyl)-N,N'-diformylhexamethylenediamine, N,N'-bis(2,2,6,6-tetramethyl-4-piperidyl)-N,N'-bishexamethylene acrylic acid amide, N,N'-bis(2,2,6,6-tetramethyl-4-piperidyl)-N,N'-bishexamethylene arachic acid amide, N,N'-bis(2,2,6,6-tetramethyl-4-piperidyl)-N,N'-bishexamethylene angelic acid amide, N,N'-bis(2,2,6,6-tetramethyl-4-piperidyl)-N,N'-bishexamethylene undecylic acid amide, N,N'-bis(2,2,6,6-tetramethyl-4-piperidyl)-N,N'-bishexamethylene undecylenic acid amide, N,N'-bis(2,2,6,6-tetramethyl-4-piperidyl)-N,N'-bishexamethylene oleic acid amide, N,N'-bis(2,2,6,6-tetramethyl-4-piperidyl)-N,N'-bishexamethylene gadoleic acid amide, N,N'-bis(2,2,6,6-tetramethyl-4-piperidyl)-N,N'-bishexamethylene caprylic acid amide, N,N'-bis(2,2,6,6-tetramethyl-4-piperidyl)-N,N'-bishexamethylene capric acid amide, N,N'-bis(2,2,6,6-tetramethyl-4-piperidyl)-N,N'-bishexamethylene caproic acid amide, N,N'-bis(2,2,6,6-tetramethyl-4-piperidyl)-N,N'-bishexamethylene crotonic acid amide, N,N'-bis(2,2,6,6-tetramethyl-4-piperidyl)-N,N'-bishexamethylene citronellic acid amide, N,N'-bis(2,2,6,6-tetramethyl-4-piperidyl)-N,N'- bishexamethylene stearic acid amide, N,N'-bis(2,2,6,6-tetramethyl-4-piperidyl)-N,N'-bishexamethylene zoomaric acid amide, N,N'-bis(2,2,6,6-tetramethyl-4-piperidyl)-N,N'-bishexamethylene tridecylic acid amide, N,N'-bis(2,2,6,6-tetramethyl-4-piperidyl)-N,N'-bishexamethylene nonadecylic acid amide, N,N'-bis(2,2,6,6-tetramethyl-4-piperidyl)-N,N'-bishexamethylene palmitic acid amide, N,N'-bis(2,2,6,6-tetramethyl-4-piperidyl)-N,N'-bishexamethylene brenzterebic acid amide, N,N'-bis(2,2,6,6-tetramethyl-4-piperidyl)-N,N'-bishexamethylene propionic acid amide, N,N'-bis(2,2,6,6-tetramethyl-4-piperidyl)-N,N'-bishexamethylene heptanoic acid amide, N,N'-bis(2,2,6,6-tetramethyl-4-piperidyl)-N,N'-bishexamethylene behenic acid amide, N,N'-bis(2,2,6,6-tetramethyl-4-piperidyl)-N,N'-bishexamethylene pelargonic acid amide, N,N'-bis(2,2,6,6-tetramethyl-4-piperidyl)-N,N'-bishexamethylene pentadecylic acid amide, N,N'-bis(2,2,6,6-tetramethyl-4-piperidyl)-N,N'-bishexamethylene margaric acid amide, N,N'-bis(2,2,6,6-tetramethyl-4-piperidyl)-N,N'-bishexamethylene myristic acid amide, N,N'-bis(2,2,6,6-tetramethyl-4-piperidyl)-N,N'-bishexamethylene lauric acid amide, N,N'-bis(2,2,6,6-tetramethyl-4-piperidyl)-N,N'-bishexamethylene linderic acid amide, N,N'-bis(2,2,6,6-tetramethyl-4-piperidyl)-N,N'-bishexamethylene valeric acid amide, N,N'-bis(2,2,6,6-tetramethyl-4-piperidyl)-N,N'-bishexamethylene acetic acid amide, N,N'-bis(2,2,6,6-tetramethyl-4-piperidyl)-N,N'-bishexamethylene myristic acid amide, N,N'-bis(2,2,6,6-tetramethyl-4-piperidyl)-N,N'-bishexamethylene butyric acid amide, a polymer of dimethyl succinate and 4-hydroxy-2,2,6,6-tetramethyl-1-piperidineethanol, polycondensate of dibutylamine, 1,3,5-triazine, and N,N'-bis(2,2,6,6-tetramethyl-4-piperidyl)butylamine, bis(1,2,2,6,6-pentamethyl-4-piperidyl)-2-(3,5-di-t-butyl-4-hydroxybenzyl)-2-n-butylmalonate, bis(2,2,6,6-tetramethyl-4-piperidyl)sebacate, poly[(6-morpholino-s-triazine-2,4-diyl)[(2,2,6,6-tetramethyl-4-piperidyl)imino]-hexamethylene[(2,2,6,6-tetramethyl-4-piperidyl)imino], poly[{(1,1,3,3-tetramethylbutyl)amino-1,3,5-triazine-2,4-diyl}{(2,2,6,6-tetramethyl-4-piperidyl)imino}hexamethylene{(2,2,6,6-tetramethyl-4-piperidyl)imino}], poly[{6-(1,1,3,3-tetramethylbutyl)amino-1,3,5-triazine-2,4-diyl}{(2,2,6,6-tetramethyl-4-piperidyl)imino}hexamethylene{(2,2,6,6-tetramethyl-4-piperidyl)imino}], a reaction product of a polymer of N,N'-bis(2,2,6,6-tetramethyl-4-piperidinyl)-1,6-hexadiamine and 2,4,6-trichloro-1,3,5-triazine, N-butyl-1-butanamine, and N-butyl-2,2,6,6-tetramethyl-4-piperidineamine.

Among them, N,N'-bis(2,2,6,6-tetramethyl-4-N-methylpiperidyl)-N,N'-diformyl-alkylenediamines, N,N'-bis(2,2,6,6-tetramethyl-4-piperidyl)-N,N'-diformylalkylenediamines, N,N'-bis(2,2,6,6-tetramethyl-4-piperidyl)-N,N'-bisalkylene fatty acid amides, and poly[{6-(1,1,3,3-tetramethylbutyl)amino-1,3,5-triazine-2,4-diyl}{(2,2,6,6-tetramethyl-4-piperidyl)imino}hexamethylene{(2,2,6,6-tetramethyl-4-piperidyl)imino}] are preferable because they are excellent in weather resistance, and N,N'-bis(2,2,6,6-tetramethyl-4-piperidyl)-N,N'-diformylalkylenediamines and the reaction product of the polymer of N,N'-bis(2,2,6,6-tetramethyl-4-piperidinyl)-1,6-hexanediamine and 2,4,6-trichloro-1,3,5-triazine, N-butyl-1-butanamine, and N-butyl-2,2,6,6-tetramethyl-4-piperidineamine are particularly preferable.

The amount of the light stabilizer is usually equal to or larger than 0.01 part by weight, preferably equal to or larger than 0.02 part by weight, and more preferably equal to or larger than 0.03 part by weight, and usually equal to or smaller than 5 parts by weight, preferably equal to or smaller than 2 parts by weight, and more preferably equal to or smaller than 1 part by weight with respect to 100 parts by weight of the hydride of the block copolymer. By setting the amount of the light stabilizer to be equal to or larger than the lower limit of the above-mentioned range, weather resistance of the adhesive layer can be enhanced. Furthermore, by setting the amount of the light stabilizer to be equal to or smaller than the upper limit, stain on the T die and the cooling roll of the extruder can be prevented when the elastomer resin is molded to manufacture the adhesive layer, thereby enhancing processability.

Examples of the ultraviolet absorbent may include a benzophenone-based ultraviolet absorbent, a salicylic acid-based ultraviolet absorbent, and a benzotriazole-based ultraviolet absorbent.

Examples of the benzophenone-based ultraviolet absorbent may include 2,4-dihydroxybenzophenone, 2-hydroxy-4-methoxybenzophenone, 2-hydroxy-4-methoxybenzophenone-5-sulfonic acid trihydrate, 2-hydroxy-4-octyloxybenzophenone, 4-dodecaloxy-2-hydroxybenzophenone, 4-benzyloxy-2-hydroxybenzophenone, 2,2',4,4'-tetrahydroxybenzophenone, and 2,2'-dihydroxy-4,4'-dimethoxybenzophenone.

Examples of the salicylic acid-based ultraviolet absorbent may include phenyl salicylate, 4-t-butylphenyl-2-hydroxybenzoate, phenyl-2-hydroxybenzoate, 2,4-di-t-butylphenyl-3,5-di-t-butyl-4-hydroxybenzoate, and hexadecyl-3,5-di-t-butyl-4-hydroxybenzoate.

Examples of the benzotriazole-based ultraviolet absorbent may include 2-(2-hydroxy-5-methylphenyl)-2H-benzotriazole, 2-(3-t-butyl-2-hydroxy-5-methylphenyl)-5-chloro-2H-benzotriazole, 2-(3,5-di-t-butyl-2-hydroxyphenyl)-5-chloro-2H-benzotriazole, 2-(3,5-di-t-butyl-2-hydroxyphenyl)-2H-benzotriazole, 5-chloro-2-(3,5-di-t-butyl-2-hydroxyphenyl)-2H-benzotriazole, 2-(3,5-di-t-amyl-2-hydroxyphenyl)-2H-benzotriazole, 2-(2-hydroxy-5-t-octylphenyl)-2H-benzotriazole, 2-(2-hydroxy-4-octylphenyl)-2H-benzotriazole, 2-(2H-benzotriazole-2-yl)-4-methyl-6-(3,4,5,6-tetrahydrophthalimidylmethyl)phenol, and 2,2'-methylenebis[4-(1,1,3,3-tetramethylbutyl)-6-[(2H-benzotriazole-2-yl)phenol]].

The amount of the ultraviolet absorbent is usually equal to or larger than 0.01 part by weight, preferably equal to or larger than 0.02 part by weight, and more preferably equal to or larger than 0.04 part by weight, and usually equal to or smaller than 1 part by weight, preferably equal to or smaller than 0.5 part by weight, and more preferably equal to or smaller than 0.3 part by weight with respect to 100 parts by weight of the hydride of the block copolymer. Although the light resistance of the adhesive layer can be improved by using the ultraviolet absorbent for an amount of equal to or larger than the lower limit of the above-mentioned range, use thereof at an excessive amount beyond the upper limit may not result in further improvement.

Examples of the antioxidant may include a phosphorus-based antioxidant, a phenol-based antioxidant, and a sulfur-based antioxidant, and the phosphorus-based antioxidant causing less coloring is preferable.

Examples of the phosphorus-based antioxidant may include monophosphite-based compounds such as triphenyl phosphite, diphenylisodecyl phosphite, phenyldiisodecyl phosphite, tris(nonylphenyl)phosphite, tris(dinonylphenyl)phosphite, tris(2,4-di-t-butylphenyl)phosphite, and 10-(3,5-di-t-butyl-4-hydroxybenzyl)-9,10-dihydro-9-oxa-10-phosphaphenanthrene-10-oxide; diphosphite-based compounds such as 4,4'-butylidene-bis(3-methyl-6-t-butylphenyl-di-tridecyl phosphite), and 4,4'-isopropylidene-bis(phenyl-dialkyl(C12-C15)phosphite); compounds such as 6-[3-(3-t- butyl-4-hydroxy-5-methylphenyl)propoxy]-2,4,8,10-tetrakis-t-butyldibenzo[d,f][1.3.2]dioxaphosphepin and 6-[3-(3,5-di-t-butyl-4-hydroxyphenyl)propoxy]-2,4,8,10-tetrakis-t-butyldibenzo[d,f][1.3.2]dioxaphosphepin.

Examples of the phenol-based antioxidant may include compounds such as pentaerythrityl-tetrakis[3-(3,5-di-t-butyl-4-hydroxyphenyl)propionate], 2,2-thio-diethylenebis[3-(3,5-di-t-butyl-4-hydroxyphenyl)propionate], octadecyl-3-(3,5-di-t-butyl-4-hydroxyphenyl)propionate, 3,9-bis{2-[3-(3-t-butyl-4-hydroxy-5-methylphenyl)propionyloxy]-1,1-dimethylethyl}-2,4,8,10-tetraoxaspiro[5,5]undecane, and 1,3,5-trimethyl-2,4,6-tris(3,5-di-t-butyl-4-hydroxybenzyl) benzene.

Examples of the sulfur-based antioxidant may include compounds such as dilauryl-3,3'-thiodipropionate, dimyristyl-3,3'-thiodipropionate, distearyl-3,3'-thiodipropionate, lauryl stearyl-3,3'-thiodipropionate, pentaerythritol-tetrakis-(β-lauryl-thio-propionate), and 3,9-bis(2-dodecylthioethyl)-2,4,8,10-tetraoxaspiro[5,5]undecane.

The amount of the antioxidant is usually equal to or larger than 0.01 part by weight, preferably equal to or larger than 0.05 part by weight, and more preferably equal to or larger than 0.1 part by weight, and usually equal to or smaller than 1 part by weight, preferably equal to or smaller than 0.5 part by weight, and more preferably equal to or smaller than 0.3 part by weight with respect to 100 parts by weight of the hydride of the block copolymer. Although heat stability of the adhesive layer can be improved by using the antioxidant for an amount of equal to or larger than the lower limit of the above-mentioned range, use thereof at an excessive amount beyond the upper limit may not result in further improvement.

Examples of the method for mixing the hydride of the block copolymer and the optional component may include a method in which the optional component is dissolved in an appropriate solvent and mixed with a solution of the hydride of the block copolymer, and the solvent is then removed to collect the elastomer resin containing the optional component; and a method in which the hydride of the block copolymer is made into a melted state and is kneaded with the optional component by a kneading machine such as a twin-screw extruder, a roll, a Brabender, and an extruder.

4.1.3. Attribute of Material of Adhesive Layer

It is preferable that the resin forming the adhesive layer has high transparency. For example, the total light transmittance measured for a sample piece of the resin forming the adhesive layer having a thickness of 1 mm is desired to be usually equal to or higher than 70%, preferably equal to or higher than 80%, and more preferably equal to or higher than 90%.

The glass transition temperature of the resin forming the adhesive layer is usually equal to or higher than 30° C., preferably equal to or higher than 50° C., and more preferably equal to or higher than 70° C., and usually equal to or lower than 200° C., preferably equal to or lower than 180° C., and more preferably equal to or lower than 160° C. When the resin containing the block copolymer is used, the resin may have a plurality of glass transition temperatures. In such a case, it is preferable that the highest glass transition temperature of the resin is within the above-mentioned range. By setting the glass transition temperature of the resin forming the adhesive layer to be within the above-mentioned range, adhesiveness when the elements are sealed and maintenance of the properties after sealing can be well balanced. When the elements of the device are sealed with the sealing film, the retardation of the layer portion provided at the sealing layer side relative to the substrate film in the sealing film after sealing can be easily confined within a desired range without thermal deterioration of the organic component contained in the elements.

4.2. Thickness of Adhesive Layer

The thickness of the adhesive layer is preferably equal to or larger than 10 μm, more preferably equal to or larger than 15 μm, still more preferably equal to or larger than 20 μm, and particularly preferably equal to or larger than 40 μm, and preferably equal to or smaller than 500 μm, more preferably equal to or smaller than 200 μm, still more preferably equal to or smaller than 150 μm, and particularly preferably equal to or smaller than 100 μm. The adhesive layer having a thickness that is equal to or larger than the lower limit of the above-mentioned range can be manufactured by extrusion molding. Furthermore, the thickness of this extent provides a sufficient sealing function and can prevent the thickness of the adhesive layer from being non-uniform due to small foreign matters even when the adhesive layer is contaminated with the foreign matters. By setting the thickness to be equal to or smaller than the upper limit, the sealing film can be formed in a uniform shape with less deflection after bonding and thickness of the sealing film can be reduced.

4.3. Method for Manufacturing Adhesive Layer

The adhesive layer is usually prepared as a long-length film with which the sealing film is manufactured. The adhesive layer may be manufactured by, e.g., molding the above-mentioned material of the adhesive layer into a film form. As the molding method, e.g., melt molding and solution casting may be used. The melt molding method may be further classified into, e.g., extrusion molding, press molding, inflation molding, injection molding, blow molding, and stretch molding. Among these methods, the extrusion molding, the inflation molding, and the press molding are preferable for obtaining the film excellent in the mechanical strength, surface precision, and the like. Furthermore, the extrusion molding is particularly preferable for manufacturing the film efficiently and easily.

5. Optional Layer

If necessary, the sealing film may include an optional layer in addition to the above-mentioned substrate film, sealing layer, and adhesive layer.

For example, an antiblocking layer may be provided on the surface of the substrate film at the opposite side to the sealing layer. Provision of the antiblocking layer can prevent blocking of the sealing film. Furthermore, the antiblocking layer can protect the surface of the sealing film when the sealing film is stored and transported. The antiblocking layer may be formed by, e.g., a method in which the surface of the substrate film is coated with a peeling agent such as a silicone-based peeling agent, a long chain alkyl-based peeling agent, a fluorine-based peeling agent, and molybdenum sulfide; or a method in which a resin layer containing a lubricant made of inactivated particles or the like is formed.

The sealing film may also include an antistatic layer, a hard coat layer, an electroconductivity application layer, a contamination preventing layer, and a concavo-convex structure layer.

6. Properties of Sealing Film

The sealing film has a tensile elastic modulus of usually equal to or higher than 1,000 MPa, preferably equal to or higher than 1,200 MPa, and more preferably equal to or higher than 1,400 MPa at a measurement temperature of 23° C. When the sealing film has such a high tensile elastic modulus, the sealing film can acquire stiffness, and handling performance of the sealing film can be improved. The preferable handling performance prevents wrinkles of the sealing film during sealing. Consequently, sealing with no gap can be easily performed. The upper limit of the tensile elastic modulus of the sealing film is usually equal to or lower than 4,000 MPa, preferably equal to or lower than 3,500 MPa, and more preferably equal to or lower than 3,000 MPa. By setting the tensile elastic modulus of the sealing film to be equal to or lower than the above-mentioned upper limit, ability of the sealing film to follow steps on the surfaces of the elements before sealing is improved, and inclusion of air bubbles after sealing can be prevented.

Although the method for adjusting the tensile elastic modulus of the sealing film to be within the above-mentioned range is not particularly limited, the tensile elastic modulus thereof can be adjusted by e.g., appropriately adjusting the materials and the thicknesses of the substrate film and the adhesive layer. The material of the adhesive layer tends to have a low tensile elastic modulus. An increased thickness of the adhesive layer can therefore lower the tensile elastic modulus of the sealing film. Alternatively, decrease in the thickness of the adhesive layer within a range where adhesiveness can be ensured can increase the tensile elastic modulus of the sealing film. In addition, use of a resin having a high tensile elastic modulus for the substrate film can also increase the tensile elastic modulus of the sealing film. In particular, the tensile elastic modulus of the sealing film can be easily adjusted by mixing a plasticizer into the adhesive layer.

The retardation of the layer portion provided at the sealing layer side relative to the substrate film in the sealing film after sealing is usually confined within a desired range. That is, in a state where the elements have been sealed using the sealing film, the retardation of the layer portion provided at the sealing layer side relative to the substrate film in the sealing film used for sealing is usually confined within the desired range. The above-mentioned layer portion is a layer portion that does not include the substrate film and usually consists of the sealing layer, the adhesive layer, and an optional layer that is provided if necessary. The specific retardation of the layer portion is usually equal to or smaller than 20 nm, preferably equal to or smaller than 15 nm, and more preferably equal to or smaller than 10 nm. By confining the retardation of the layer portion after sealing within the above-mentioned range, reflection prevention performance of the anti-reflective film including the circularly polarizing plate can be prevented from lowering when the anti-reflective film and the sealing film are combined. When the sealing film is used for sealing a display device such as an organic electroluminescent display device (this may be appropriately referred to hereinbelow as "organic EL display device"), it can prevent display quality of the display device from lowering.

The retardation of the layer portion provided at the sealing layer side relative to the substrate film in the sealing film after sealing may be measured by the following method.

A sample film is manufactured in the same manner as the manufacture of the measurement subject sealing film except that a film with retardation of equal to or smaller than 2 nm is used in place of the substrate film and the optional layer provided on the substrate film at the opposite side to the sealing layer in the measurement subject sealing film. The sample film is bonded to a glass plate under specific sealing conditions to prepare a measurement sample. The retardation of the measurement sample is measured. The value of the measured retardation of the measurement sample is rendered as the retardation of the layer portion provided at the sealing layer side relative to the substrate film in the sealing film after sealing. In this case, when the retardation of the substrate film and the optional layer provided on the substrate film at the opposite side to the sealing layer in the sealing film is as small as equal to or smaller than 2 nm, e.g., the sample film is not necessarily required to be manufactured and the sealing film is bonded to the glass plate for measurement of the retardation.

The sealing conditions when the sample film is bonded to the glass plate for the above-mentioned measurement of the retardation are a temperature of Tg+5° C. to Tg+50° C. and a laminate pressure of 0.05 MPa to 1.0 MPa. Tg represents the glass transition temperature of the resin forming the adhesive layer. When the resin forming the adhesive layer has a plurality of glass transition temperatures, Tg represents the highest glass transition temperature among them. In the case of the sealing film of the present invention, when the retardation of the layer portion provided at the sealing layer side relative to the substrate film in the sealing film after sealing is measured at least one point within the range defined as the above-mentioned sealing conditions, the measured retardation is confined within the above-mentioned desired range.

Although the method for adjusting the retardation of the layer portion of the sealing film after sealing to be within the above-mentioned range is not particularly limited, e.g., the retardation may be adjusted by adjusting the type of the polymer contained in the resin forming the adhesive layer, the composition ratio of the monomers, and the glass transition temperature of the resin. As a specific example, adjustment may be achieved by decreasing the photoelastic coefficient of the polymer by adjusting the type of the polymer contained in the resin forming the adhesive layer or the composition ratio of the monomers. When the adhesive layer is formed with the resin containing the polymer having such a low photoelastic coefficient, tendency of expressing retardation upon application of stress to the adhesive layer can be reduced. For example, when the hydride of the aromatic vinyl compound-conjugated diene block copolymer is used for forming the adhesive layer, it is preferable to use a block copolymer in which hydrogenation is effected upto the aromatic ring portions in order to reduce the aromatic rings having a high photoelastic coefficient. The retardation of the layer portion of the sealing film after sealing may also be adjusted to be within the above-mentioned range by, e.g., decreasing the glass transition temperature of the resin forming the adhesive layer with the plasticizer and reducing heat stress generated in adhesion.

The sealing film of the present invention is excellent in barrier property. Specifically, the water vapor permeability of the entire sealing film is preferably equal to or lower than $1\times10^{-2}$ g/m$^2$·day and more preferably equal to or lower than $5\times10^{-3}$ g/m$^2$·day. The above-mentioned water vapor permeability can be achieved by appropriately selecting the materials and the thicknesses of the sealing layer and other layers. Although the lower limit is ideally zero, it is practically equal to or higher than $1\times10^{-6}$ g/m$^2$·day.

It is preferable that the sealing film of the present invention has low tendency to lose the barrier property thereof even when it is placed under a high temperature environment. Specifically, it is preferable that the water vapor permeability can be retained within the low range as mentioned above even when the sealing film is left under an environment of 85° C. for 100 hours. Furthermore, it is preferable that the amount of outgas generated from the sealing film is small even when it is placed in a low pressure environment. The sealing film with such a property has high barrier property and can preferably maintain the barrier property even under a high temperature or low pressure environment, thereby exerting excellent weather resistance. In particular, reduction in generation amount of water vapor as the outgas is effective in order to prevent deterioration of the elements containing the organic component. The sealing film can be realized by, e.g., using the adhesive layer containing the hydride of the specific block copolymer having two or more polymer blocks [A] per molecule and one or more polymer blocks [B] per molecule.

The transparency of the sealing film is not particularly limited. However, it is preferable that the sealing film has a high transparency in order to render the sealing film to be useful for a portion required to transmit light. In this case, the total light transmittance of the sealing film is preferably equal to or higher than 70%, more preferably equal to or higher than 80%, and particularly preferably equal to or higher than 90%.

The haze of the sealing film is not particularly limited. However, when the sealing film is used for an optical application that is not particularly intended to diffuse light, it is generally preferable that the sealing film has a low haze. In this case, the haze of the sealing film is preferably equal to or lower than 3.0% and more preferably equal to or lower than 1.0%.

7. Method for Manufacturing Sealing Film

The sealing film may be manufactured by, e.g., a manufacturing method including a step of forming a sealing layer on at least one surface of the substrate film to obtain a multilayer film, and a step of stacking the multilayer film and the adhesive layer and pressure-bonding them with heat.

The method for forming the sealing layer on the surface of the substrate film is as described in the section of explanation of the sealing layer. The multilayer film including the substrate film and the sealing layer may be obtained by forming the sealing layer on the surface of the substrate film. The multilayer film is usually obtained as a long-length film.

The multilayer film thus obtained is pressure-bonded with heat to the adhesive layer using, e.g., a pressing device such as a temperature-controllable pressing roll. In this case, the surface of the multilayer film at the sealing layer side is laminated to the adhesive layer. When the elastomer resin is used as the material for forming the adhesive layer, the adhesive layer becomes flexible to exert high adhesiveness during the pressure-bonding with heat. With the exerted adhesiveness, the adhesive layer adheres to the multilayer film. Thus, the sealing film including the substrate film, the sealing layer, and the adhesive layer is obtained.

The temperature at which the pressure-bonding with heat is performed is usually equal to or higher than 70° C. and preferably equal to or higher than 80° C. Thereby adhesion of the multilayer film including the substrate film and the sealing layer and the adhesive layer can be stably effected. The upper limit of the temperature is usually equal to or lower than 250° C. and is preferably equal to or lower than the glass transition temperature of the resin that the substrate film has. Thereby heat shrinkage and deterioration of the substrate film during the pressure-bonding with heat can be prevented.

The pressure at which the heating and pressure-bonding are performed is usually equal to or higher than 0.05 MPa. Thereby adhesion of the multilayer film including the substrate film and the sealing layer to the adhesive layer can be stably effected. The upper limit of the pressure is usually equal to or lower than 1.5 MPa and preferably equal to or lower than 1.0 MPa. Thereby generation of cracks in the sealing layer due to excessive pressure can be prevented.

8. Applications of Sealing Film

The sealing film is usually used in an organic electronic device including an element such as the organic EL element and the organic semiconductor element, for sealing the element. Usually, the sealing is performed by a procedure wherein the sealing film is placed along the surface of the element with the surface of the sealing film at the adhesive layer side facing the surface of the element, and the sealing film is then pressure-bonded to the element at a specific sealing temperature for sealing. As the sealing film of the present invention has preferable handling performance, wrinkles during the sealing can be prevented. Consequently, sealing can be easily performed with no gap therebetween. Accordingly, the sealing film can stably protect components constituting the element from water and oxygen, thereby maintaining performance of the element for a long period of time.

The sealing temperature is usually equal to or higher than Tg+5° C., preferably equal to or higher than Tg+10° C., and more preferably equal to or higher than Tg+20° C. Tg represents the glass transition temperature of the resin forming the adhesive layer. When the resin forming the adhesive layer has a plurality of glass transition temperatures, Tg represents the highest glass transition temperature among them. Retardation of the layer portion provided at the sealing layer side relative to the substrate film in the sealing film after sealing can thereby be adjusted to be within the above-mentioned desired range. Furthermore, the adhesive layer is sufficiently flexible at such a temperature that is higher than the glass transition temperature. The adhesive layer can therefore make close contact with the surfaces of the elements with no gap therebetween even when the surfaces of the elements are not flat, and high barrier property can thereby be obtained. In particular, when a display surface of a display device is sealed using the sealing film, minute irregularities on the display surface can be reduced to improve visual perception of display. The upper limit of the sealing temperature is usually equal to or lower than Tg+150° C., preferably equal to or lower than Tg+120° C., and more preferably equal to or lower than Tg+100° C. Orientation relaxation of the substrate film and heat deterioration of the elements due to heat in sealing can thereby be prevented.

Among devices to which the sealing film is applied, preferable examples thereof may include display devices such as an organic EL display device and a liquid crystal display device. These display devices may be a flexible display device having a screen that can be bent. Other than the display devices, the sealing film is preferably applicable to an organic semiconductor device including organic semiconductor elements. These devices include an element such as an organic EL element and an organic semiconductor element as an element for exerting functions of the devices and further include a sealing film sealing the element. The devices including the sealing film will be described hereinbelow referring to embodiments.

8.1. First Embodiment

Figure 2:
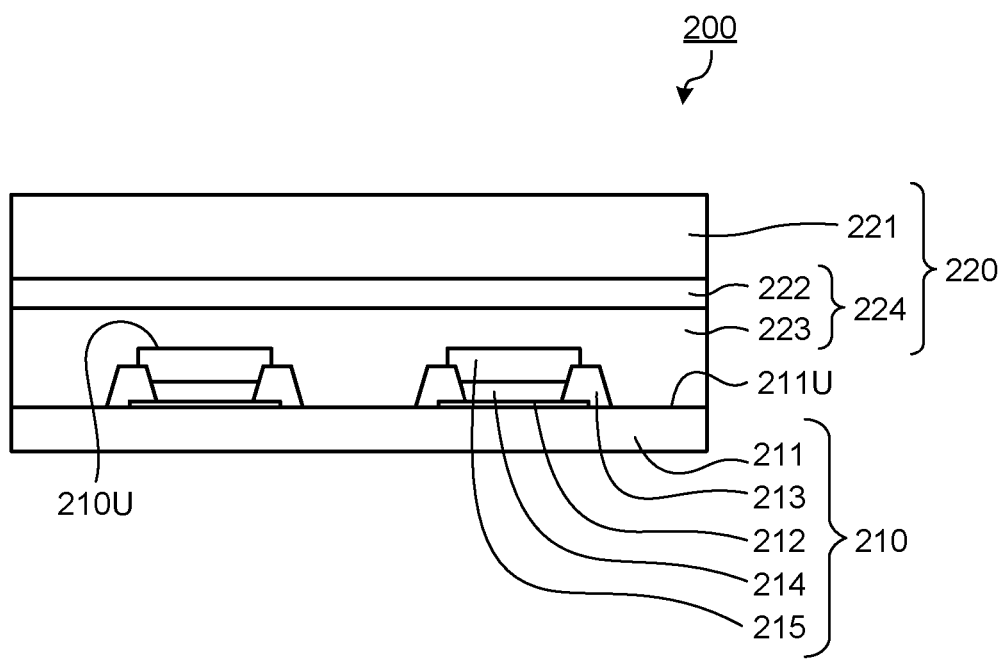
FIG. 2 is a vertical sectional view schematically illustrating an organic EL display device according to a first embodiment of the present invention.
Figure 3:
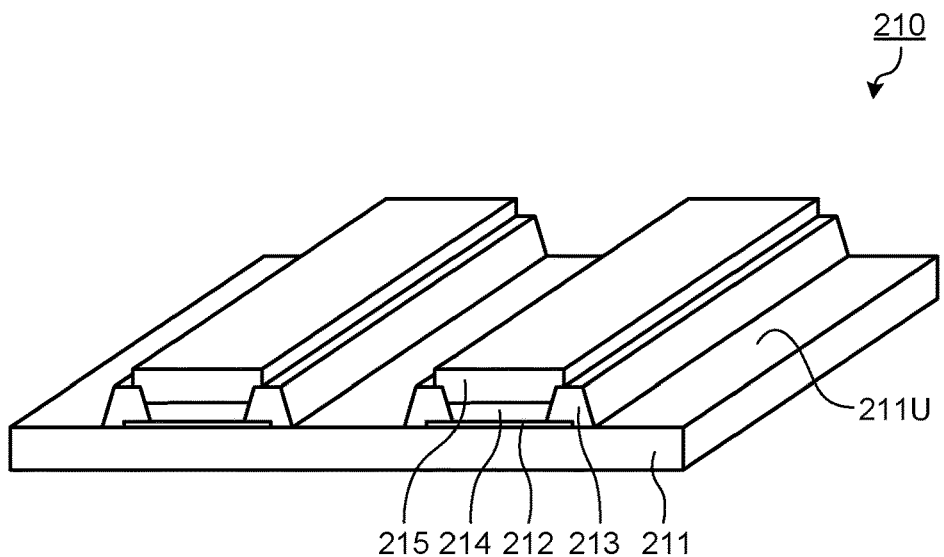
FIG. 3 is a perspective view schematically illustrating an assembly included in the organic EL display device in the first embodiment of the present invention.

FIG. 2 is a vertical sectional view schematically illustrating an organic EL display device 200 according to a first embodiment of the present invention. FIG. 3 is a perspective view schematically illustrating an assembly 210 included in the organic EL display device 200 in the first embodiment of the present invention.

As illustrated in FIG. 2, the organic EL display device 200 according to the first embodiment of the present invention includes the assembly 210 formed by constituent components such as light emitting elements and a sealing film 220 sealing the light emitting elements included in the assembly 210.

As illustrated in FIG. 3, the assembly 210 includes a substrate plate 211, a large number of first electrode layers 212 formed on an upper surface 211U of the substrate plate 211 in an elongated stripe form, edge cover layers 213 formed on the peripheries of the first electrode layers 212, light emitting layers 214 provided on the first electrode layers 212, and second electrode layers 215 provided on the light emitting layers 214.

The first electrode layers 212, the light emitting layers 214, and the second electrode layers 215 constitute the light emitting elements as the organic EL elements. By applying electricity to the first electrode layers 212 and the second electrode layers 215, light emission from the light emitting layers 214 can be achieved.

Materials, thicknesses, and manufacturing methods of components constituting the assembly 210 are not particularly limited.

Examples of the material of the substrate plate 211 may include a flexible substrate plate made of transparent plastic having flexibility, such as polycarbonate, polyethylene terephthalate, polyethylene naphthalate, and alicyclic olefin polymer, and a glass substrate plate made of silica glass, soda glass, and inorganic alkali glass.

As the materials for forming the first electrode layers 212 and the second electrode layers 215, materials that may be used as electrodes of the organic EL elements may be appropriately selected for use. Either one of the first electrode layer 212 and the second electrode layer 215 may be configured as an anode and the other thereof may be configured as a cathode. By configuring one of the first electrode layer 212 and the second electrode layer 215 as a transparent electrode and the other thereof as a reflection electrode, light emission passing through the transparent electrode can be achieved. Alternatively, both the first electrode layer 212 and the second electrode layer 215 may be configured as the transparent electrodes. Examples of the material of the transparent electrodes may include a metal thin film, ITO, IZO, and $SnO_2$. Examples of the material of the reflection electrode layers may include aluminum and MgAg.

The light emitting layers 214 that are provided between the first electrode layers 212 and the second electrode layers 215 are not particularly limited and known ones may be appropriately selected. The light emitting layer 214 may be formed of one sole layer of one type or of a combination of layers of a plurality of types to be configured as a layer emitting light having a desired peak wavelength such that they are suitable for an application as a light source.

Optional layers such as hole injection layers, hole transport layers, electron transport layers, electron injection layers, and gas barrier layers may be further provided between the first electrode layers 212 and the second electrode layers 215, in addition to the light emitting layers 214. These optional layers may be constituent components of the light emitting elements.

Examples of the specific layer structure of each light emitting element may include a structure of anode/hole transport layer/light emitting layer/cathode, a structure of the anode/hole transport layer/light emitting layer/electron injection layer/cathode, a structure of the anode/hole injection layer/light emitting layer/cathode, a structure of the anode/hole injection layer/hole transport layer/light emitting layer/electron transport layer/electron injection layer/cathode, a structure of the anode/hole transport layer/light emitting layer/electron injection layer/equipotential surface formation layer/hole transport layer/light emitting layer/electron injection layer/cathode, and a structure of the anode/hole transport layer/light emitting layer/electron injection layer/charge generation layer/hole transport layer/light emitting layer/electron injection layer/cathode. The light emitting element may include one or more light emitting layers 214 between the anode and the cathode. The light emitting layer 214 may include a multilayer body having a plurality of layers with different emission colors, and may also include a mixed layer of a certain pigment layer that is doped with different pigments. Examples of the material forming the light emitting layer 214 may include polyparaphenylene vinylene-based materials, polyfluorene-based materials, and polyvinyl carbazole-based materials. Examples of the material of the hole injection layer and the hole transport layer may include phthalocyanine-based materials, arylamine-based materials, and polythiophene-based materials. Examples of the material of the electron injection layer and the electron transport layer may include aluminum complexes and lithium fluoride. Examples of the material of the equipotential surface formation layer and the charge generation layer may include transparent electrodes made of ITO, IZO, $SnO_2$, and the like, and metal thin films made of Ag, Al, and the like.

The first electrode layers 212, the light emitting layers 214, the second electrode layers 215, and other optional layers constituting the light emitting elements may be provided by sequentially laminating them on the substrate plate 211. The thickness of each layer may be set to 10 nm to 1,000 nm.

The assembly 210 may further include optional constituent components such as wirings for applying electricity to the first electrode layers 212 and the second electrode layers 215.

As illustrated in FIG. 2, the sealing film 220 includes a substrate film 221, a sealing layer 222, and an adhesive layer 223 in this order from the side farther from the assembly 210, and is bonded to an upper surface 210U of the assembly 210 with adhesion force of the adhesive layer 223. With this embodiment, explained is an example wherein the adhesive layer 223 containing the hydride of the specific block copolymer having two or more polymer blocks [A] per molecule and one or more polymer blocks [B] per molecule is used. The retardation of the substrate film 221 is approximately zero and the retardation of the layer portion 224 formed of the sealing layer 222 and the adhesive layer 223 in the sealing film 220 is equal to or smaller than 20 nm.

With this structure, in the organic EL display device 200 according to the first embodiment of the present invention, the sealing film 220 seals the light emitting elements including the light emitting layers 214. In addition, the amount of outgas such as water vapor, a solvent, and a residual monomer generated from the sealing film 220 is small. Therefore, preferable sealing is achieved to enhance performance of the organic EL display device 200 such as the lifetime thereof.

In addition, deformation capability of the adhesive layer 223 of the sealing film 220 covers irregularities of the surface 210U of the assembly 210. As a result, strength of the organic EL display device 200 can be enhanced.

Furthermore, the retardation of the substrate film 221, the sealing layer 222, and the adhesive layer 223 of the sealing film 220 is small, which reduces tendency to cause unintended change on a polarization state of light when the light from the light emitting layers 214 passes through the sealing film 220. With this configuration, display performance such as color and brightness can be controlled appropriately, thereby providing high display quality.

The organic EL display device 200 may be manufactured by, e.g., pressure-bonding the sealing film 220 to the assembly 210. The sealing film 220 has a high tensile elastic modulus and preferable handling performance. The sealing film 220 is therefore less prone to have wrinkles in the pressure bonding and is provided to make close contact with the entire surface 210U of the assembly 210. Therefore, the sealing film 220 can stably prevent deterioration of all the light emitting elements that the organic EL display device 200 includes, to thereby prevent generation of dark spots. The dark spots are regions appearing dark that are generated when the organic material of the light emitting elements is deteriorated and some light emitting elements cannot emit light in the organic EL display device 200.

8.2. Second Embodiment

Figure 4:
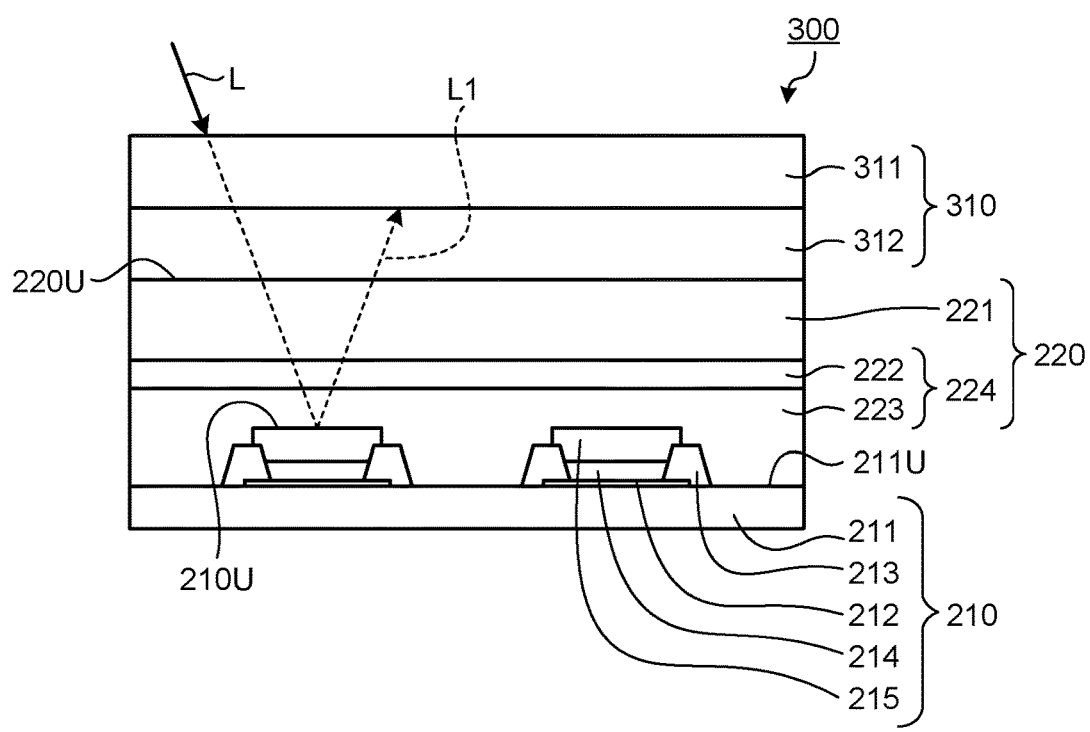
FIG. 4 is a vertical sectional view schematically illustrating an organic EL display device according to a second embodiment of the present invention.

FIG. 4 is a vertical sectional view schematically illustrating an organic EL display device 300 according to a second embodiment of the present invention. Among constituent components of the organic EL display device 300 according to the second embodiment, those that are the same as the constituent components of the organic EL display device 200 according to the first embodiment are denoted by the same reference numerals as those for the organic EL display device 200 according to the first embodiment.

As illustrated in FIG. 4, the organic EL display device 300 according to the second embodiment of the present invention includes an anti-reflective film 310 formed by a circularly polarizing plate on a surface 220U of the sealing film 220 at the opposite side to the assembly 210. The anti-reflective film 310 includes a linearly polarizing plate 311 and a quarter wavelength plate 312 in this order from the side farther from the sealing film 220. The organic EL display device 300 according to the second embodiment of the present invention has the same constitution as that of the organic EL display device 200 according to the first embodiment other than the above-mentioned matters.

When natural light L that is unpolarized light is incident on the organic EL display device 300 having this constitution, light L1 as a linear polarization component having the oscillation direction parallel with a transmission axis of the linearly polarizing plate 311 passes through the linearly polarizing plate 311 and the linearly polarizing plate 311 absorbs light other than the light L1. The light L1 that has passed through the linearly polarizing plate 311 then passes through the quarter wavelength plate 312 and is converted from the linearly polarized light into circularly polarized light. Then, the light L1 passes through the sealing film 220, and is reflected by the surface 210U of the assembly 210. Thereafter, the light L1 further passes through the sealing film 220, and then passes through the quarter wavelength plate 312 again and is converted into linearly polarized light. After that, the light L1 is incident on the linearly polarizing plate 311. In this case, as the retardation of the substrate film 221 of the sealing film 220 is approximately zero and the retardation of the layer portion 224 formed by the sealing layer 222 and the adhesive layer 223 of the sealing film 220 is equal to or smaller than 20 nm, the polarization state of the light L1 that has passed through the linearly polarizing plate 311 does not therefore change largely when it passes through the sealing film 220. That is, the light L1 is incident on the linearly polarizing plate 311 in a state of including almost no linearly polarized light having the oscillation direction parallel with the transmission axis of the linearly polarizing plate 311 and the linearly polarizing plate 311 absorbs most of the light L1. Accordingly, the anti-reflective film 310 can prevent reflection of the external light L. Thus, the sealing film 220 in the embodiment can perform sealing without inhibiting the reflection prevention function by the anti-reflective film 310.

Moreover, the organic EL display device 300 according to this embodiment can provide the same advantages as those of the organic EL display device 200 according to the first embodiment.

8.3. Third Embodiment

Figure 5:
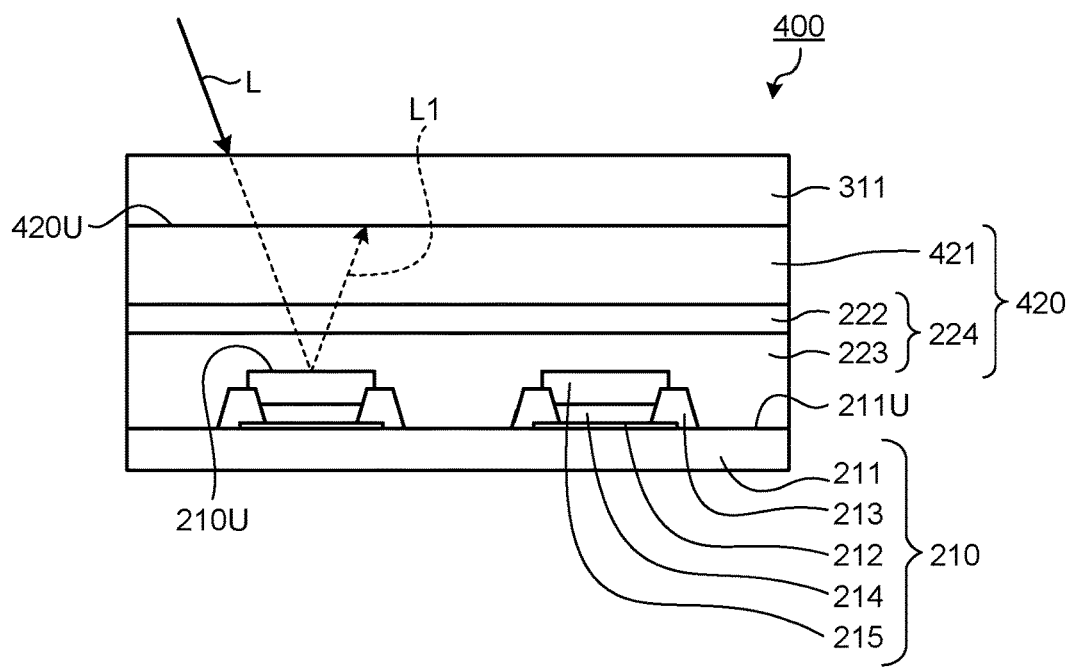
FIG. 5 is a vertical sectional view schematically illustrating an organic EL display device according to a third embodiment of the present invention.

FIG. 5 is a vertical sectional view schematically illustrating an organic EL display device 400 according to a third embodiment of the present invention. Among constituent components of the organic EL display device 400 according to the third embodiment, those that are the same as the constituent components of the organic EL display devices 200 and 300 according to the first embodiment and the second embodiment are denoted by the same reference numerals as those for the organic EL display devices 200 and 300 according to the first embodiment and the second embodiment.

As illustrated in FIG. 5, the organic EL display device 400 according to the third embodiment of the present invention includes a sealing film 420 in place of the sealing film 220. The sealing film 420 has the same constitution as that of the sealing film 220 according to the first embodiment except that the sealing film 420 includes, in place of the substrate film 221, a substrate film 421 capable of functioning as a quarter wavelength plate. The organic EL display device 400 also includes the linearly polarizing plate 311 on a surface 420U of the sealing film 420 at the opposite side to the assembly 210, and the combination of the linearly polarizing plate 311 and the substrate film 421 constitutes an anti-reflective film formed of a circularly polarizing plate. The organic EL display device 400 according to the third embodiment of the present invention has the same constitution as that of the organic EL display device 200 according to the first embodiment other than the above-mentioned matters.

In the organic EL display device 400 having this constitution, the anti-reflective film constituted by the combination of the linearly polarizing plate 311 and the substrate film 421 can prevent reflection of the external light L in the same manner as the organic EL display device 300 according to the second embodiment. Furthermore, a quarter wavelength plate is not required to be additionally prepared because the substrate film 421 of the sealing film 420 functions as the quarter wavelength plate of the anti-reflective film. The thickness of the organic EL display device 400 can therefore be reduced.

The organic EL display device 400 according to this embodiment can provide the same advantages as those of the organic EL display devices 200 and 300 according to the first and the second embodiments.

8.4. Fourth Embodiment

Figure 6:
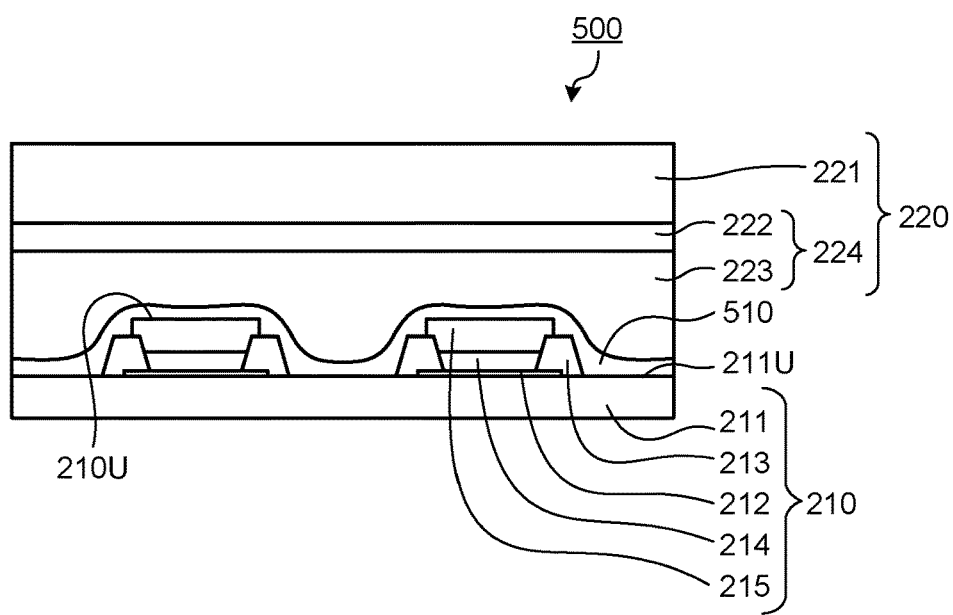
FIG. 6 is a vertical sectional view schematically illustrating an organic EL display device according to a fourth embodiment of the present invention.

FIG. 6 is a vertical sectional view schematically illustrating an organic EL display device 500 according to a fourth embodiment of the present invention. Among constituent components of the organic EL display device 500 according to the fourth embodiment, those that are the same as the constituent components of the organic EL display devices 200, 300 and 400 according to the first embodiment to the third embodiment are denoted by the same reference numerals as those for the organic EL display devices 200, 300 and 400 according to the first embodiment to the third embodiment.

As illustrated in FIG. 6, the organic EL display device 500 according to the fourth embodiment of the present invention has the same constitution as that of the organic EL display device 200 according to the first embodiment except that a temporary sealing layer 510 is provided between the assembly 210 and the sealing film 220.

The temporary sealing layer 510 is a layer provided on the upper surface 210U of the assembly 210. Examples of the material thereof may include a material containing silicon such as SiN and SiO. The thickness of the temporary sealing layer 510 may be set to approximately 0.2 μm to 1 μm.

The temporary sealing layer 510 may be formed by, e.g., a film formation method such as vapor deposition under a reduced pressure environment that is same as that for the light emitting layers 214 and the second electrode layers 215. Accordingly, the light emitting layers 214, the second electrode layers 215, and the temporary sealing layer 510 are continuously provided under the reduced pressure environment, thereby effectively preventing deterioration of the light emitting layers 214. Furthermore, by sealing them with the sealing film 220 after being taken out of the reduced pressure environment, firm sealing capable of withstanding using environment of the organic EL display device 500 can be formed. Accordingly, the organic EL display device 500 that causes less deterioration of the light emitting elements in manufacturing and retains this state for a long period of time even under the using environment can be obtained.

Moreover, the organic EL display device 500 according to this embodiment can provide the same advantages as those of the organic EL display device 200 according to the first embodiment.

8.5. Fifth Embodiment

Figure 7:
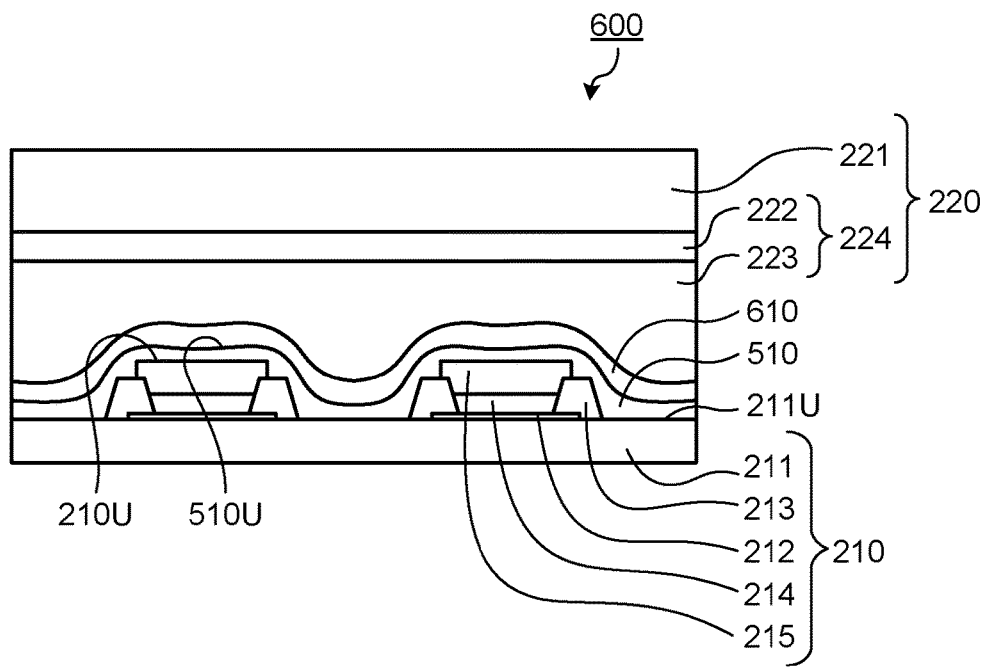
FIG. 7 is a vertical sectional view schematically illustrating an organic EL display device according to a fifth embodiment of the present invention.

FIG. 7 is a vertical sectional view schematically illustrating an organic EL display device 600 according to a fifth embodiment of the present invention. Among constituent components of the organic EL display device 600 according to the fifth embodiment, those that are the same as the constituent components of the organic EL display devices 200, 300, 400 and 500 according to the first embodiment to the fourth embodiment are denoted by the same reference numerals as those for the organic EL display devices 200, 300, 400 and 500 according to the first embodiment to the fourth embodiment.

As illustrated in FIG. 7, the organic EL display device 600 according to the fifth embodiment of the present invention has the same constitution as that of the organic EL display device 200 according to the first embodiment except that the temporary sealing layer 510 and an absorbent layer 610 are provided between the assembly 210 and the sealing film 220.

The absorbent layer 610 is a layer provided on an upper surface 510U of the temporary sealing layer 510. Examples of the material thereof may include an organic aluminum complex. The thickness of the absorbent layer 610 may be set to approximately 0.1 μm to 1 μm.

By the provision of the absorbent layer 610, still more firm sealing can be achieved. For example, the absorbent layer 610 can absorb the outgas that can be slightly emitted from the sealing film 220, thereby further preventing deterioration of the layers such as the light emitting layers 214.

Moreover, the organic EL display device 600 according to this embodiment can provide the same advantages as those of the organic EL display devices 200 and 500 according to the first embodiment and the fourth embodiment.

8.6. Sixth Embodiment

Figure 8:
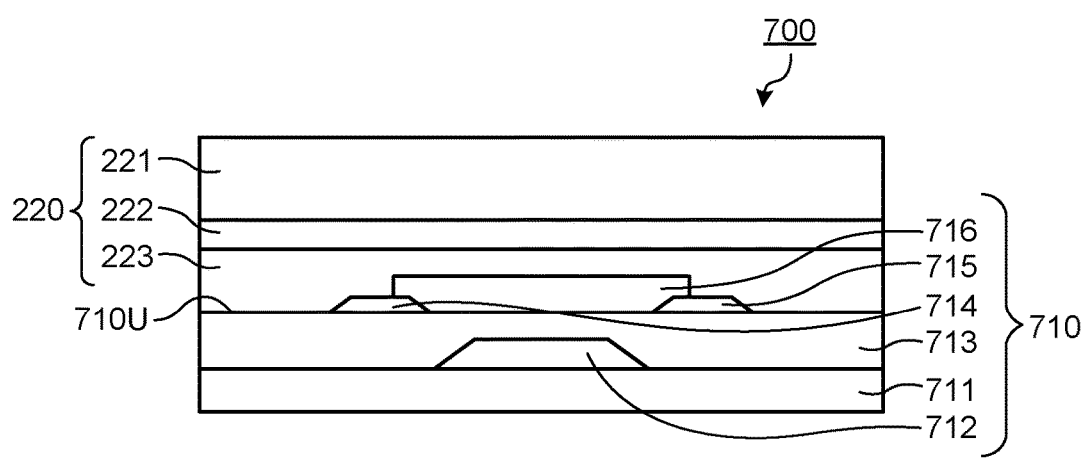
FIG. 8 is a vertical sectional view schematically illustrating an organic semiconductor device according to a sixth embodiment of the present invention.

FIG. 8 is a vertical sectional view schematically illustrating an organic semiconductor device 700 according to a sixth embodiment of the present invention. Among constituent components of the organic semiconductor device 700 according to the sixth embodiment, those that are the same as the constituent components of the organic EL display devices 200, 300, 400, 500 and 600 according to the first embodiment to the fifth embodiment are denoted by the same reference numerals as those for the organic EL display devices 200, 300, 400, 500 and 600 according to the first embodiment to the fifth embodiment.

As illustrated in FIG. 8, the organic semiconductor device 700 according to the sixth embodiment of the present invention includes an assembly 710 and the sealing film 220 provided on an upper surface 710U of the assembly 710. The assembly 710 includes a substrate plate 711, a gate electrode 712 provided on the upper surface of the substrate plate 711, a gate electrode insulating layer 713 provided on the upper surfaces of the substrate plate 711 and the gate electrode 712, and a semiconductor layer 716, a source electrode 714, and a drain electrode 715 provided on the upper surface of the gate electrode insulating layer 713. Materials, thicknesses, and manufacturing methods of components constituting the organic semiconductor device 700 are not particularly limited and known ones may be employed.

Examples of the material of the substrate plate 711 may include a flexible substrate plate made of plastic having flexibility, such as polycarbonate, polyimide, polyethylene terephthalate, polyethylene naphthalate, and an alicyclic olefin polymer, a glass substrate plate made of silica glass, soda glass, and inorganic alkali glass, and a silicon substrate plate made of silicon wafer.

The gate electrode 712 may be made of, e.g., an electroconductive material. Examples of the electroconductive material may include platinum, gold, silver, nickel, chrome, copper, iron, tin, antimony lead, tantalum, indium, palladium, tellurium, rhenium, iridium, aluminum, ruthenium, germanium, molybdenum, tungsten, antimony tin oxide, indium tin oxide (ITO), fluorine-doped zinc oxide, zinc, carbon, graphite, glassy carbon, a silver paste and a carbon paste, lithium, beryllium, magnesium, potassium, calcium, scandium, titanium, manganese, zirconium, gallium, niobium, sodium, a sodium-potassium alloy, a magnesium/copper mixture, a magnesium/silver mixture, a magnesium/aluminum mixture, a magnesium/indium mixture, an aluminum/aluminum oxide mixture, and a lithium/aluminum mixture. An electroconductive polymer having improved electroconductivity by doping or the like may also be used. Examples of the electroconductive polymer may include electroconductive polyaniline, electroconductive polypyrrole, and electroconductive polythiophene. Examples of the electroconductive polythiophene may include a complex of polyethylenedioxythiophene and polystyrenesulfonic acid. Among them, chrome and molybdenum are preferable and chrome is more preferable. One type thereof may be solely used, and two or more types thereof may also be used in combination at any ratio.

The gate electrode 712 may be formed in a predetermined pattern on the substrate plate 711 by forming the above-mentioned electroconductive material on the substrate plate 711 by a sputtering method or the like, and then performing etching processing.

As the material of the gate insulating film 713, a material having sealing property, humidity resistance, insulation property, and chemical resistance is preferable. Specific examples of the material of the gate insulating film 713 may include thermoplastic resin such as polyimide, polyester, polyethylene naphthalate, polycarbonate, polyethylene, polyethylene terephthalate, and polyethersulfone. One type thereof may be solely used, and two or more types thereof may also be used in combination at any ratio. Furthermore, a resin that is the same as that for the adhesive layer 223 of the sealing film 220 may also be used.

The semiconductor layer 716 may be formed with, e.g., an organic semiconductor. Examples of the organic semiconductor for, e.g., p channel-type semiconductors may include small molecule semiconductors such as pentacene, naphthacene, thiophene oligomers, perylene, and α-sexiphenyl, and derivatives thereof, naphthalene, anthracene, and rubrene, and derivatives thereof, coronene and derivatives thereof, and metal-containing/metal-free phthalocyanine and derivatives thereof, and macromolecular semiconductors such as thiophene- and fluorene-based polyalkylthiophene, and polyalkylfluorene and derivatives thereof. One type thereof may be solely used, and two or more types thereof may also be used in combination at any ratio.

The semiconductor layer 716 may be formed by forming the above-mentioned organic semiconductor on the gate insulating film 713 by a coating method, a CVD method, or the like, and then, patterning it to give a predetermined pattern shape.

The source electrode 714 and the drain electrode 715 may be made of an electroconductive material. As the electroconductive material, e.g., the material that is the same as that for the above-mentioned gate electrode 712 may be used. The source electrode 714 and the drain electrode 715 may be formed in predetermined patterns on the semiconductor layer 716 by forming the above-mentioned electroconductive material on the semiconductor layer 716 by a sputtering method or the like, and then performing etching processing.

In FIG. 8, as the organic semiconductor device 700 includes the sealing film 220 provided on the upper surface 710U of the assembly 710, sealing of the semiconductor layer 716, the source electrode 714, and the drain electrode 715 is achieved by the gate electrode insulating layer 713 and the sealing film 220. In addition, the amount of outgas such as water vapor, a solvent, and a residual monomer generated from the sealing film 220 is small. Therefore, preferable sealing is provided to enhance performance of the organic semiconductor device 700 such as the lifetime thereof.

In addition, deformation capability of the adhesive layer 223 of the sealing film 220 covers irregularities of the surface 710U of the assembly 710. As a result, strength of the organic EL display device 700 can be enhanced.

EXAMPLES

Hereinbelow, the present invention will be described in detail referring to Examples. However, the present invention is not limited to the following Examples and may be subject to any modification for implementation in a range without departing from the scope of the present invention and equivalents thereto.

Unless otherwise specified, "%" and "part" that represent amounts in the following description are on a weight basis. Unless otherwise specified, the operations that will be described hereinbelow were performed under the conditions at a room temperature and at a normal pressure.

[Measurement Method]

(1. Method for Measuring Tensile Elastic Modulus)

The tensile elastic modulus of the film was measured in accordance with JISK7162. In this measurement, a distance between evaluation points was set to 25 mm, a tensile speed was set to 50 mm/min, and a measurement temperature was set to 23° C.

(2. Method for Measuring Retardation])

The retardation of the layer portion of the film was measured at a wavelength of 550 nm using an automatic birefringence meter ("KOBRA-21" manufactured by Oji Scientific Instruments Co., Ltd.).

Manufacturing Example 1: Structural Body Including Organic EL Elements

Figure 9:
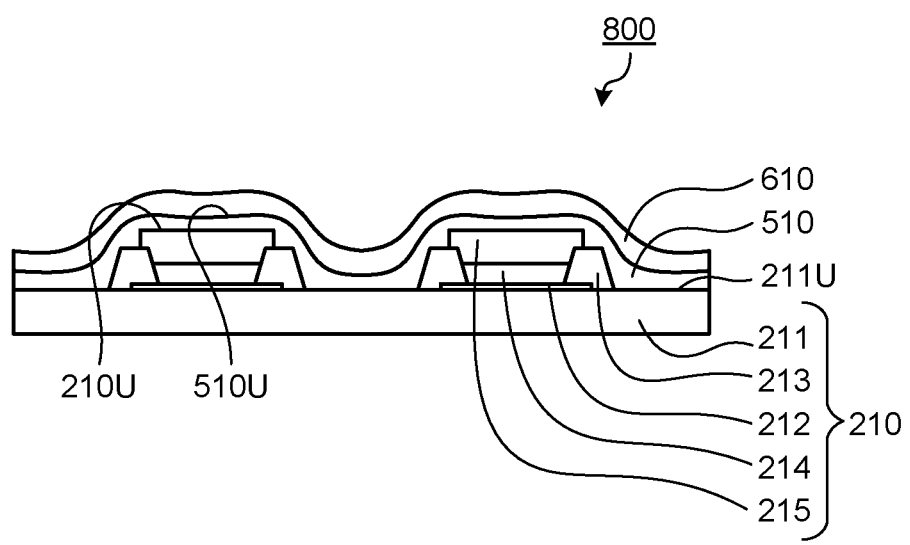
FIG. 9 is a vertical sectional view schematically illustrating a structural body produced in Examples and Comparative Examples of the present invention.

FIG. 9 is a vertical sectional view schematically illustrating a structural body 800 produced in Examples and Comparative Examples of the present invention. The constitution of the structural body 800 including the organic EL elements that was produced in Examples and Comparative Examples was as schematically illustrated in FIG. 9.

On an upper surface 211U of a substrate plate 211 made of glass having light transmissivity, an aluminum layer was formed by vapor deposition (under reduced pressure of $1\times10^{-4}$ Pa). The aluminum layer was trimmed by photolithography to be in a shape of stripes each having a thickness of 0.05 μm, a width of 500 and a length of 10 mm. Thus, anodes as first electrode layers (reflection electrodes) 212 were formed.

Then application of a photoresist ("ZWD6216" manufactured by ZEON Corporation) and photolithography were performed to form edge cover layers 213 each having a thickness of 1.0 μm on the peripheries of the anodes.

Subsequently, NPB (4,4'-bis[N-(1-naphthyl)-N-phenylamino]biphenyl) was deposited by vapor deposition on the anodes to form hole transport layers (not illustrated) each having a thickness of 40 nm.

Subsequently, ADS082 (4,4-bis(diphenylvinylene)-biphenyl) as a blue light-emitting material was deposited by vapor deposition on the hole transport layers to form light emitting layers 214 that are capable of emitting blue light each having a thickness of 0.05 μm.

Subsequently, tris(8-hydroxyquinolinato)aluminum (Alq3) was deposited by vapor deposition to form electron transport layers (not illustrated) each having a thickness of 0.05 μm.

Subsequently, LiF was deposited by vapor deposition on the electron transport layers to form buffer layers (not illustrated) each having a thickness of 0.5 nm.

Subsequently, ITO was deposited by vapor deposition on the buffer layers to form cathodes (transparent electrodes) each having a thickness of 0.25 μm as second electrode layers 215. An assembly 210 was thereby obtained.

Subsequently, SiN was deposited on the upper surface 210U of the assembly 210 to cover the entirety of the formed layers and the substrate plate. With this deposition, a temporary sealing layer 510 having a thickness of 0.2 μm was formed.

The deposition of the hole transport layers to the temporary sealing layer were subsequently performed while maintaining the condition of the pressure of $1\times10^{-4}$ Pa to $1\times10^{-6}$ Pa.

Then, the surface of the temporary sealing layer 510 was coated with absorbent compound ("OleDry-F" manufactured by FUTABA CORPORATION) and was baked at 100° C. to form an absorbent layer 610 having a thickness of 0.5 μm.

With the above-mentioned operations, the structural body 800 including the assembly 210, the temporary sealing layer 510, and the absorbent layer 610 in this order was produced.

Manufacturing Example 2: Manufacturing of Sealing Resin

A block copolymer having a triblock structure in which polymer blocks [A] bonded to both ends of a polymer block [B] was manufactured using styrene as an aromatic vinyl compound and using isoprene as a linear conjugated diene compound with the following procedures.

In a reactor vessel equipped with a stirring device in which an inner portion was sufficiently purged with nitrogen, 256 parts of anhydrous cyclohexane, 25.0 parts of anhydrous styrene, and 0.615 part of n-dibutyl ether were placed. 1.35 parts of n-butyllithium (15%-cyclohexane solution) was added thereto while stirring the mixture at 60° C. to initiate polymerization. Reaction was continued at 60° C. for 60 minutes while the mixture was stirred. The polymerization conversion rate at this time point was 99.5% (the polymerization conversion rate was measured by the gas chromatography. The same holds true for the following.).

Thereafter, 50.0 parts of anhydrous isoprene was added and the resultant mixture was continuously stirred at the same temperature for 30 minutes. The polymerization conversion rate at this time point was 99%.

After that, 25.0 parts of anhydrous styrene was further added and the resultant mixture was stirred at the same temperature for 60 minutes. The polymerization conversion rate at this time point was approximately 100%.

Then, 0.5 part of isopropyl alcohol was added to the reaction solution to terminate the reaction, to thereby obtain a solution (i) containing a block copolymer.

The weight-average molecular weight (Mw) of the block copolymer in the solution (i) thus obtained was 44,900 and the molecular weight distribution (Mw/Mn) thereof was 1.03.

Subsequently, the solution (i) was transferred to a pressure-resistant reactor vessel equipped with a stirring device. 4.0 parts of a silica-alumina-carrying nickel catalyst (E22U, nickel carried amount 60%: manufactured by JGC Catalysts and Chemicals Ltd.) as a hydrogenation catalyst and 350 parts of anhydrous cyclohexane were added thereto and mixed. An inner portion of the reactor vessel was purged with hydrogen gas and hydrogen was further supplied thereto while the solution was stirred. The hydrogenation reaction was performed at a temperature of 170° C. and at a pressure of 4.5 MPa for 6 hours to hydrogenate the block copolymer. With this process, a solution (iii) containing a hydride (ii) of the block copolymer was obtained. The weight-average molecular weight (Mw) of the hydride (ii) in the solution (iii) was 45,100 and the molecular weight distribution (Mw/Mn) thereof was 1.04.

After completion of the hydrogenation reaction, the solution (iii) was filtrated to remove the hydrogenation catalyst. Thereafter, 1.0 part of a xylene solution in which 0.1 part of 6-[3-(3-t-butyl-4-hydroxy-5-methylphenyl)propoxy]-2,4,8,10-tetrakis-t-butyldibenzo[d,f][1.3.2]dioxaphosphepin ("SUMILIZER (registered trademark) GP" manufactured by Sumitomo Chemical Company, Limited. This will be referred to hereinbelow as "antioxidant A") as a phosphorus-based antioxidant was dissolved was added to and dissolved in the filtrated solution (iii), to thereby obtain a solution (iv).

Then, the solution (iv) was filtrated through a Zeta Plus (registered trademark) filter 30H (manufactured by CUNO, Inc. pore diameter of 0.5 μm to 1 μm) and was further filtrated through another filter (pore diameter of 0.4 μm, manufactured by NICHIDAI CORPORATION) made of a metal fiber sequentially to remove minute solid contents. Cyclohexane, xylene, and other volatile components as solvents were removed from the filtrated solution (iv) at a temperature of 260° C. and a pressure of equal to or lower than 0.001 MPa using a cylindrical concentration/drying machine (product name "Kontro" manufactured by Hitachi, Ltd.). Then, the solid content was extruded into a strand form in a melted state from a die directly connected to the cylindrical concentration/drying machine, was cooled, and was cut by a pelletizer to obtain 85 parts of pellets (v) of sealing resin containing the hydride of the block copolymer and the antioxidant A. The weight-average molecular weight (Mw) of the hydride of the block copolymer in the pellets (v) thus obtained was 45,000 and the molecular weight distribution (Mw/Mn) thereof was 1.08. The hydrogenation rate thereof was 99.9%.

Manufacturing Example 3: Manufacturing of Film (1) as Adhesive Layer 2.0 parts of vinyl trimethoxysilane and 0.2 part of di-t-butyl peroxide were added to 100 parts of the pellets (v) obtained in Manufacturing Example 2 to obtain a mixture. The mixture was kneaded at a barrel temperature of 210° C. for retention time of 80 seconds to 90 seconds using a twin-screw extruder. The kneaded mixture was extruded and molded by a pelletizer to obtain pellets (vi). The glass transition temperature Tg of the pellets (vi) was evaluated at a tan δ peak of a dynamic viscoelasticity measuring device. The glass transition temperatures Tg thereof were −50° C. and 125° C.

The pellets (vi) were single-screw extrusion-molded at a barrel temperature of 200° C. to obtain a film (1) having a thickness of 50 μm as a film to be used as an adhesive layer.

Manufacturing Example 4: Manufacturing of Film (2) as Adhesive Layer

A film (2) having a thickness of 30 μm was obtained as a film to be used as an adhesive layer in the same manner as Manufacturing Example 3 except that the thickness was changed.

Manufacturing Example 5: Manufacturing of Film (3) as Adhesive Layer 100 parts by weight of the pellets (vi) obtained in Manufacturing Example 3 were charged in a twin-screw extruder (product name "TEM37BS" manufactured by TOSHIBA MACHINE CO., LTD.) including a side feeder capable of adding liquid and were extruded at a resin temperature of 190° C. During the extrusion, polyisobutene (product name "Nisseki Polybutene LV-100", number-average molecular weight of 500, manufactured by JX Nippon Oil & Energy Corporation) as a plasticizer was continuously added from the side feeder such that a ratio of the plasticizer was 10 parts by weight with respect to 100 parts by weight of the pellets (vi). The extrusion was performed such that the product was in a strand form. The extruded resin was cooled with the air, and then cut by a pelletizer to obtain pellets (vii). The glass transition temperature Tg of the pellets (vii) was evaluated at a tan δ peak of a dynamic viscoelasticity measuring device. The glass transition temperatures Tg thereof were −40° C. and 99° C.

The pellets (vii) were single-screw extrusion-molded at a barrel temperature of 180° C. to obtain a film (3) having a thickness of 50 μm as a film to be used as an adhesive layer.

Manufacturing Example 6: Manufacturing of Film (4) as Adhesive Layer

A film (4) having a thickness of 80 μm was obtained as a film to be used as an adhesive layer in the same manner as Manufacturing Example 3 except that the thickness was changed.

Manufacturing Example 7: Manufacturing of Film (5) as Adhesive Layer

A film (5) having a thickness of 50 μm was obtained as a film to be used as an adhesive layer in the same manner as Manufacturing Example 3 except that the pellets (v) as the sealing resin obtained in Manufacturing Example 2 were used in place of the pellets (vi).

Manufacturing Example 8: Manufacturing of Film (6) as Adhesive Layer

A film (6) having a thickness of 180 μm was obtained as a film to be used as an adhesive layer in the same manner as Manufacturing Example 3 except that the pellets (v) as the sealing resin obtained in Manufacturing Example 2 were used in place of the pellets (vi) and that the thickness was changed.

Example 1

(1-1. Manufacturing of Sealing Film)

A roll-form alicyclic polyolefin resin film (film containing a norbornene polymer, "ZEONOR film ZF16" manufactured by ZEON Corporation, thickness 60 μm, retardation 2 nm) was prepared as a substrate film. On one surface of the substrate film, a SiN film having a thickness of 200 nm was formed as the sealing layer by using a sputtering apparatus to obtain a multilayer film (5). A part of the multilayer film (5) was cut out and the water vapor permeability of the film was measured. It was found to be $4 \times 10^{-3}$ g/m$^2$·day.

The film (1) manufactured in Manufacturing Example 3 was prepared as the adhesive layer. The film (1) was a film formed by a styrene-isoprene-styrene copolymer. The above-mentioned styrene-isoprene-styrene copolymer was a polymer prepared by hydrogenating an aromatic vinyl compound-conjugated diene block copolymer produced using styrene as the aromatic vinyl compound and using isoprene as the linear conjugated diene compound and further modifying it with alkoxysilane, and had a triblock structure in which the polymer blocks [A] bonded to both ends of the polymer block [B]. The weight-average molecular weight (Mw) of the styrene-isoprene-styrene copolymer was 45,000, the ratio "wA/wB" of the weight fractions of the polymer blocks was 50/50, and the ratio "Mw(A1)/Mw (A2)" of the weight-average molecular weight of the polymer blocks [A] was 1.08. Furthermore, the hydrogenation rate was 99.9% and the styrene-isoprene-styrene copolymer had the glass transition temperatures of −50° C. and 125° C.

The above-mentioned film (1) was placed on the surface of the above-mentioned multilayer film (5) at the sealing layer side. The multilayer film (5) and the film (1) were conveyed in the lengthwise direction while being interposed between a pair of opposing resin rolls from both sides for giving pressure. In this operation, the temperature of the resin rolls was adjusted to 150° C. The line speed in conveyance was set to 0.3 m/min. Furthermore, the pressure by the resin rolls was set to 0.1 MPa. With these processes, the multilayer film (5) and the film (1) were pressure-bonded to obtain a sealing film (6) having a thickness of 110 μm that had a layer structure of the substrate film, the sealing layer, and the film (1).

(1-2. Evaluation of Sealing Film)

The tensile elastic modulus of the sealing film (6) was measured.

The handling performance was evaluated by taking the sealing film (6) on an evaluator's hand. The sealing film (6) had sufficient stiffness and the handling performance thereof was preferable.

Furthermore, the sealing film (6) was attached to a glass with the conditions for adhesion that are the same as those for adhesion to the structural body, which will be described later, and the retardation of the sealing film (6) was measured. With the measurement, a value of the retardation of the layer portion formed by the sealing layer and the film (1) in the sealing film (6) after sealing was obtained. The layer portion formed by the sealing layer and the film (1) is the layer portion provided at the sealing layer side relative to the substrate film.

(1-3. Manufacturing and Evaluation of Organic EL Device)

The surface of the above-mentioned sealing film (6) was pressure-bonded at the film (1) side to the surface of the absorbent layer 610 of the structural body 800 as illustrated in FIG. 9 obtained in Manufacturing Example 1 at a sealing temperature of 150° C. while applying pressure of 0.1 MPa thereto for effecting heat sealing. With this pressure application, as illustrated in FIG. 7, an organic EL device 600 capable of emitting blue light and including the assembly 210, the temporary sealing layer 510, the absorbent layer 610, the adhesive layer 223 formed by the film (1), the sealing layer 222, and the substrate film 221 was obtained.

Electricity was applied to the organic EL device thus obtained, and lighting thereof with no problem was confirmed.

Thereafter, the organic EL device was subjected to heat processing at 85° C. for 300 hours in a non-lighting state. After that, the organic EL device was returned to room temperature, and electricity was again applied. Then, presence of dark spots on the light emitting surface was observed.

(1-4. Evaluation when Combined with Anti-Reflective Film)

A circularly polarizing plate having a combination of a linearly polarizing plate made of polyvinyl alcohol to which iodine was adsorbed and a quarter λ plate was prepared. The circularly polarizing plate as an anti-reflective film was bonded to the sealing film (6) of the above-mentioned organic EL device such that the quarter wavelength plate faced the sealing agent. Thereafter, image reflection of the external light on the surface to which the circularly polarizing plate was bonded was observed under lighting with a fluorescent lamp for checking presence of image reflection.

Example 2

The film (2) manufactured in Manufacturing Example 4 was used as the adhesive layer in place of the film (1) manufactured in Manufacturing Example 3.

Manufacturing and evaluation of the sealing film and the organic EL device were performed in the same manner as Example 1 other than the above-mentioned matter.

Example 3

The film (3) manufactured in Manufacturing Example 5 was used as the adhesive layer in place of the film (1) manufactured in Manufacturing Example 3.

The sealing temperature when the organic EL device was manufactured was changed from 150° C. to 125° C.

Manufacturing and evaluation of the sealing film and the organic EL device were performed in the same manner as Example 1 other than the above-mentioned matters.

Example 4

The film (5) manufactured in Manufacturing Example 7 was used as the adhesive layer in place of the film (1) manufactured in Manufacturing Example 3.

Manufacturing and evaluation of the sealing film and the organic EL device were performed in the same manner as Example 1 other than the above-mentioned matter.

Example 5

The film (6) manufactured in Manufacturing Example 8 was used as the adhesive layer in place of the film (1) manufactured in Manufacturing Example 3.

Manufacturing and evaluation of the sealing film and the organic EL device were performed in the same manner as Example 1 other than the above-mentioned matter.

Example 6

A polymethyl methacrylate resin ("ACRYPET VH001" manufactured by MITSUBISHI RAYON CO., LTD.) was dried, and then single-screw extrusion-molded at a barrel temperature of 230° C., to obtain a resin film having a thickness of 150 μm. The resin film was used as the substrate film in place of the alicyclic polyolefin resin film.

Furthermore, the film (2) manufactured in Manufacturing Example 4 was used as the adhesive layer in place of the film (1) manufactured in Manufacturing Example 3.

Manufacturing and evaluation of the sealing film and the organic EL device were performed in the same manner as Example 1 other than the above-mentioned matters.

Comparative Example 1

An alicyclic polyolefin resin film (film containing a norbornene polymer, "ZEONOR film ZF16" manufactured by ZEON Corporation, thickness 20 μm, retardation 1 nm) was used as the substrate film.

The film (4) manufactured in Manufacturing Example 6 was used as the adhesive layer in place of the film (1) manufactured in Manufacturing Example 3.

Manufacturing and evaluation of the sealing film and the organic EL device were performed in the same manner as Example 1 other than the above-mentioned matters.

Reference Example 1

The sealing temperature when the organic EL device was manufactured was changed from 150° C. to 133° C.

Manufacturing and evaluation of the sealing film and the organic EL device were performed in the same manner as Example 1 other than the above-mentioned matter.

[Results]

The results of Examples and Comparative Examples are indicated in the following Table 1 and Table 2. In Table 1 and Table 2, meanings of abbreviations are as follows.

"ZNR": alicyclic olefin resin film

"HSIS(N)": film formed with a silane-modified hydrogenated styrene-isoprene-styrene copolymer "HSIS(LowT)": film formed with a styrene-isoprene-styrene copolymer containing a plasticizer "HSIS(NS)": film formed with a hydrogenated styrene-isoprene-styrene copolymer "PMMA": film formed with polymethylmethacrylate resin "Re": retardation of a layer portion provided at the sealing layer side relative to the substrate film in the sealing film "Dark spot": dark spot on the light emitting surface of the organic EL device after heat processing "Image reflection": image reflection when the anti-reflective film is provided on the sealing film of the organic EL device

TABLE 1

[Results of Examples 1 to 4]

| | | Ex. 1 | Ex. 2 | Ex. 3 | Ex. 4 |
|---|---|---|---|---|---|
| Substrate film | Type | ZNR | ZNR | ZNR | ZNR |
| | Thickness | 60 μm | 60 μm | 60 μm | 60 μm |
| Sealing layer | Type | SiN | SiN | SiN | SiN |
| | Thickness | 0.2 μm | 0.2 μm | 0.2 μm | 0.2 μm |
| Adhesive layer | Type | HSIS (N) | HSIS (N) | HSIS (LowT) | HSIS (NS) |
| | Thickness | 50 μm | 30 μm | 50 μm | 50 μm |
| Sealing temperature | | 150° C. | 150° C. | 125° C. | 150° C. |
| Tensile elastic modulus | (MPa) | 1488 | 1685 | 1443 | 1510 |
| Re | (nm) | 10 | 7 | 9 | 12 |
| Dark spots | | No | No | No | No |
| Image reflection | | No | No | No | No |

TABLE 2

[Results of Examples 5 and 6, Comparative Example 1 and Reference Example 1]

| | | Ex. 5 | Ex. 6 | Comp. Ex. 1 | Ref. Ex. 1 |
|---|---|---|---|---|---|
| Substrate film | Type | ZNR | PMMA | ZNR | ZNR |
| | Thickness | 60 μm | 150 μm | 20 μm | 60 μm |
| Sealing layer | Type | SiN | SiN | SiN | SiN |
| | Thickness | 0.2 μm | 0.2 μm | 0.2 μm | 0.2 μm |

TABLE 2-continued

[Results of Examples 5 and 6, Comparative Example 1 and Reference Example 1]

|  |  | Ex. 5 | Ex. 6 | Comp. Ex. 1 | Ref. Ex. 1 |
|---|---|---|---|---|---|
| Adhesive layer | Type | HSIS (NS) | HSIS (N) | HSIS (N) | HSIS (N) |
|  | Thickness | 180 μm | 30 μm | 80 μm | 50 μm |
| Sealing temperature |  | 150° C. | 150° C. | 150° C. | 133° C. |
| Tensile elastic modulus | (MPa) | 1030 | 2860 | 938 | 1488 |
| Re | (nm) | 14 | 10 | 16 | 28 |
| Dark spots |  | Slightly exist** | No | Yes* | No |
| Image reflection |  | No | No | No | Yes |

*Wrinkles occurred at the edge of the device. Dark spots were also observed at the edge of the device.
**Dark spots in a non-problematic degree were observed at the corner of the device.

[Discussion]

The sealing film having a low tensile elastic modulus as demonstrated in Comparative Example 1 has less stiffness and is prone to have wrinkles. If minute wrinkles occurs in sealing process, gaps between the structural body and the sealing film occur due to the wrinkles. When water and oxygen enter the gaps, the elements are deteriorated and the light emitting function of some elements is therefore lowered, resulting in generation of dark spots. By contrast, in each of Examples 1 to 6, the sealing films have high tensile elastic moduli and high stiffness. These films are thus less prone to have wrinkles. The structural body can thereby be sealed with no gap. As a result, generation of the dark spots was successfully prevented.

Furthermore, in each of Examples 1 to 6, the sealing film has sufficiently small retardation. It was confirmed that, even when each of these films is used in combination with the anti-reflective film formed by the circularly polarizing plate, reflection of external light can be prevented and image reflection due to the reflection of the external light can be prevented.

In Reference Example 1, sealing was performed under an intentionally inappropriate sealing condition using the sealing film that is the same as that of Example 1, as an example. In Reference Example 1, the sealing conditions generating large retardation in the adhesive layer was employed. In Reference Example 1, the adhesive layer having the large retardation changes the polarization state of the external light passing through the adhesive layer, resulting in lowering of the reflection prevention function by the anti-reflective film. In view of the above-mentioned results, it is understood that when the sealing film is used for optical applications such as the display device, the sealing film has technical significance in a range of the retardation after sealing.

DESCRIPTION OF NUMERALS

100 sealing film
110 substrate film
120 sealing layer
130 adhesive layer
200 organic EL display device
210 assembly
210U upper surface of assembly
211 substrate plate
211U upper surface of substrate plate
212 first electrode layer
213 edge cover layer
214 light emitting layer
215 second electrode layer
220 sealing film
221 substrate film
222 sealing layer
223 adhesive layer
224 layer portion formed of sealing layer and adhesive layer in sealing film
300 organic EL display device
310 anti-reflective film
311 linearly polarizing plate
312 quarter wavelength plate
400 organic EL display device
420 sealing film
421 substrate film
500 organic EL display device
510 temporary sealing layer
510U upper surface of temporary sealing layer
600 organic EL display device
610 absorbent layer
700 organic semiconductor device
710 assembly
710U upper surface of assembly
711 substrate
712 gate electrode
713 gate electrode insulating layer
714 source electrode
715 drain electrode
716 semiconductor layer
800 structural body

The invention claimed is:

1. A sealing film comprising a substrate film, a sealing layer, and an adhesive layer in this order, wherein
    the sealing film has a tensile elastic modulus of equal to or higher than 1,000 MPa,
    retardation of a layer portion provided at the sealing layer side relative to the substrate film in the sealing film after sealing is equal to or smaller than 20 nm,
    the substrate film is a resin film, and the resin forming the substrate film is a thermoplastic resin, and
    the sealing layer is made of an inorganic material.

2. The sealing film according to claim 1, wherein the adhesive layer contains a hydrogenated block copolymer elastomer.

3. The sealing film according to claim 2, wherein
    the hydrogenated block copolymer elastomer is hydride formed by hydrogenating equal to or higher than 90% of all unsaturated bonds of a block copolymer,
    the block copolymer has two or more polymer blocks [A] per molecule of the copolymer, and one or more polymer blocks [B] per molecule of the copolymer, the block [A] having as a main component an aromatic vinyl compound unit, and the block [B] having as a main component a linear conjugated diene compound unit, and
    a ratio (wA/wB) between a weight fraction wA of all the polymer blocks [A] and a weight fraction wB of all the polymer blocks [B] in the entire block copolymer is 20/80 to 60/40.

4. The sealing film according to claim 1, wherein the resin forming the substrate film is an alicyclic olefin resin.

5. An organic electroluminescent display device comprising the sealing film according to claim 1.

6. An organic semiconductor device comprising the sealing film according to claim 1.

7. An organic electroluminescent display device comprising the sealing film according to claim 2.

8. An organic semiconductor device comprising the sealing film according to claim 2.

9. An organic electroluminescent display device comprising the sealing film according to claim 3.

10. An organic semiconductor device comprising the sealing film according to claim 3.

11. An organic electroluminescent display device comprising the sealing film according to claim 4.

12. An organic semiconductor device comprising the sealing film according to claim 4.

13. The sealing film according to claim 1, wherein the resin forming the substrate film is a resin selected from a group consisting of a polyester resin, a polyacrylate resin, and an olefin resin.

14. The sealing film according to claim 1, wherein the water vapor permeability of the sealing layer is equal to or lower than 1.0 g/m$^2$·day.

15. The sealing film according to claim 1, wherein the sealing film has a tensile elastic modulus of equal to or lower than 4,000 MPa.

16. The sealing film according to claim 1, wherein the inorganic material is one or more materials selected from the group consisting of metals, metal oxides, metal nitrides, metal oxynitrides, silicon oxides, silicon nitrides, and silicon oxynitrides.

* * * * *